US007116950B2

(12) United States Patent
Tanaka et al.

(10) Patent No.: US 7,116,950 B2
(45) Date of Patent: Oct. 3, 2006

(54) DIRECT-CONVERSION TRANSMITTING CIRCUIT AND INTEGRATED TRANSMITTING/RECEIVING CIRCUIT

(75) Inventors: Satoshi Tanaka, Kokubunji (JP); Masamichi Tanabe, Tokyo (JP); Yasuyuki Okuma, Kokubunji (JP); Taizo Yamawaki, Tokyo (JP); Koichi Yahagi, Takasaki (JP); Hiroaki Matsui, Takasaki (JP); Robert Astle Henshaw, Cambridge (GB)

(73) Assignees: Renesas Technology Corp., Tokyo (JP); Hitachi Device Engineering Co., Ltd., Nobara (JP); TTPCom Limited, Royston Hertfordshire (GB)

( * ) Notice: Subject to any disclaimer, the term of this patent is extended or adjusted under 35 U.S.C. 154(b) by 450 days.

(21) Appl. No.: 10/073,029

(22) Filed: Feb. 12, 2002

(65) Prior Publication Data

US 2003/0092416 A1 May 15, 2003

(30) Foreign Application Priority Data

Nov. 15, 2001 (GB) ............................... 0127422.4

(51) Int. Cl.
*H04B 1/04* (2006.01)
(52) U.S. Cl. ............ 455/125; 455/114.2; 455/118
(58) Field of Classification Search ............ 455/114.1, 455/114.2, 118, 120, 125
See application file for complete search history.

(56) References Cited

U.S. PATENT DOCUMENTS

| 3,501,709 | A |   | 3/1970 | Uetrecht |
|---|---|---|---|---|
| 5,896,421 | A | * | 4/1999 | Zamat et al. ............... 375/296 |
| 5,990,738 | A |   | 11/1999 | Wright et al. |
| 6,021,323 | A |   | 2/2000 | Vagher |
| 6,366,622 | B1 | * | 4/2002 | Brown et al. ............... 375/322 |
| 6,600,911 | B1 | * | 7/2003 | Morishige et al. .......... 455/307 |
| 6,721,368 | B1 | * | 4/2004 | Younis et al. ............... 375/295 |
| 6,731,923 | B1 | * | 5/2004 | Atkinson ..................... 455/323 |
| 2001/0051507 | A1 | * | 12/2001 | Ichihara ..................... 455/86 |
| 2002/0042256 | A1 | * | 4/2002 | Baldwin et al. ......... 455/232.1 |

(Continued)

FOREIGN PATENT DOCUMENTS

EP          0 274 784 A1    7/1988

(Continued)

OTHER PUBLICATIONS

"RF Circuits Technique of Dual-band Transceiver IC for GSM and DCS1800 application", Takikawa, et al.; IEEE 25th European Solid-State Circuits Conference; pp. 278-281; 1999.

*Primary Examiner*—Nguyen T. Vo
*Assistant Examiner*—Nhan T. Le
(74) *Attorney, Agent, or Firm*—Antonelli, Terry, Stout and Kraus, LLP.

(57) ABSTRACT

A transmitter is provided which includes a transmitting circuit that does not require a high-performance low noise VCO restricting cost reduction thereof and that can reduce the number of parts without requiring an RF filter. A direct conversion that does not require a transmission VCO is applied to the transmitting circuit. In order to achieve noise reduction in a receiving band, low-pass filters are provided a IQ input sections of a modulator that converts IQ signals into RF signals. In comparison with a conventional transmitter using offset PLL, an external VCO required in addition to an RF integrated circuit, a power amplifier, and a front end circuit is reduced. Even in current transistor performance, by using a filter having rapid waveform characteristics such as a SAW more inexpensive than the VCO, or the like, it is possible to provide a GSM/GSM 1800/GSM1900 triple band transmitter.

14 Claims, 20 Drawing Sheets

U.S. PATENT DOCUMENTS

2002/0137487 A1 * 9/2002 Yochem .................... 455/303

FOREIGN PATENT DOCUMENTS

| | | | |
|---|---|---|---|
| EP | 0 865 165 A2 | 9/1998 |
| EP | 1 102 413 A2 | 5/2001 |
| GB | 2 365 638 A | 2/2002 |

* cited by examiner

|  | Modulator | Driver Amplifier | Power Amplifier | FEM | Output |
|---|---|---|---|---|---|
| Signal Level (dBm) | −8 | 3 | 32 | 30 | 30 |
| Gain |  | 11 | 29 | −2 |  |
| NF |  | 4 | 12 | 2 |  |
| Spur Level in Receiving Frequency Band (dBm/Hz) | −160.0 | −148.6 | −119.4 | −121.4 |  |
| Spur Level in Receiving Frequency Band (dBm/100kHz) | −110.0 | −98.6 | −69.4 | −71.4 | −71 |

Frequency Filter Amplitude Response (kHz)

Frequency Filter Group Delay Response (kHz)

| | Modulator | Driver Amplifier | Power Amplifier | FEM | Output |
|---|---|---|---|---|---|
| Signal Level (dBm) | −5 | 3 | 35 | 33 | 30 |
| Gain | | 8 | 32 | −2 | |
| NF | | 3 | 7 | 2 | |
| Spur Level in Receiving Frequency Band (dBm/Hz) | −171.0 | −160.0 | −127.1 | −129.1 | |
| Spur Level in Receiving Frequency Band (dBm/100kHz) | −121.0 | −110.0 | −77.1 | −79.1 | −79 |

DIRECT-CONVERSION TRANSMITTING CIRCUIT AND INTEGRATED TRANSMITTING/RECEIVING CIRCUIT

BACKGROUND OF THE INVENTION

The present invention relates to mobile communication equipment, and particularly to a direct-conversion transmitting circuit suitable for large scale integration and to an integrated transmitting/receiving circuit using the same.

According to rapid spread of the mobile communication equipment, requests for miniaturization and lower cost thereof have increased. Because of this, it is expected to apply a voltage control type oscillator (VCO), or an integrated circuit whose filter number is reduced and whose integration is enhanced. What is given as one conventional example of transmitting equipment is "RF Circuits Technique of Dual-Band Transceiver IC for GSM and DCS1800 applications" published in pages 278 to 281 of manuscripts for IEEE 25th European Solid-State Circuits Conference on 1999 by K. Takikawa et al.

As an important item on a transmitting circuit design, reduction of noise leakage into receiving frequency band has been given. FIG. 2 shows a relationship between transmission power defined by specifications for European cellular phones (GSM) and noise generated in receiving band. As indicated by an allowed output spur level 202 in a GSM receiving band, it is required that noise in receiving a band 204 at slightly 20 MHz distant from an upper limit of a transmission band 203 is suppressed up to −79 dBm/100 kHz (−129 dBm/Hz) or less relative to a maximum output power of 33 dBm in a GSM output signal 201. That is, a difference between a transmission signal and a noise level is required to be −112 dBc or more. If a band pass filter or the like is applied to an output portion of a power amplifier, the above-mentioned specification can be achieved. However, decrease in efficiency thereof is generated due to influence on losses of the filter. Thus, an offset PLL is applied as a constitution using no filter.

FIG. 18 is a circuit constitution diagram showing a transmitter to which the offset PLL is applied. The transmitter is composed of an IF signal generating section 1815 and a PLL section 1814. First, an operation of the IF section will be described here. I and Q signals each having a band of 200 kHz are input. These input signals are mixed in intermediate frequency (IF) local signals 1812 and 1813 each having a phase difference of 90° and mixers 1808 and 1809, respectively. In this case, the local signals 1812 and 1813 are obtained by phase-shifting an output of the VCO 1806 by a 90° phase shifter 1807. By adding outputs of the mixers 1808 and 1809, the input signals are converted into a GMSK (Gaussian Minimum Shift Keying) modulation signal of an IF frequency (270 MHz), respectively. The GMSK modulation signal is a modulation signal adopted in the GSM system, and has signal information only in a phase, and is constant in amplitude. In order to provide a sufficient amplitude to a phase comparator 1802 located at a downstream side of the circuit, the IF signal is amplified at an amplifier 1810. After harmonics generated by the mixers 1808 and 1809 and the amplifier 1810 are removed by a low-pass filter 1811, the IF signal is input to the phase comparator 1802 of the a PLL section 1814.

The PLL section 1814 is characterized by including a mixer 1801, and converts a frequency of an output signal of the VCO 1800 operated by an RF frequency, into an IF frequency $f_{IF}$ (270 MHz), by means of a mixer 1801, and outputs amounts of error between the IF signal and the output signal of the VCO 1800 by means of the phase comparator 1802. A frequency of the output error signal is lowered up to a baseband signal band that is the same as the I and Q input signals. High frequency noise of the error signal is suppressed by the low-pass filter 1803. A cutoff frequency of a PLL closed loop of a filter, the PLL closed loop which is denoted by reference numeral 1816, is about 1.6 MHz in a signal band of 200 kHz, and a noise of 20 MHz is greatly suppressed. Because of this, the noise generated in band which is a 20 MHz distant from an output signal of the VCO 1800 is greatly suppressed. Therefore, even if an output of the VCO 1800 is directly connected to a power amplifier PA, it is possible to suppress noises of receiving band up to −79 dBm/100 kHz (−129 dBm/Hz) or less without newly connecting a filter to an RF signal.

In a transmitter using the offset PLL, although a portion 1817 enclosed in solid line shown in FIG. 18 is integrated, the VCO 1800 is an external part because low noise characteristics are required. However, if the offset PLL is used, an external filter for high frequency is not required. Therefore, it is possible to be widely applied as a transmitter with high efficiency.

SUMMARY OF THE INVENTION

As described previously, a conventional example applying an offset PLL has been used as a transmitter because requiring no external filter. However, in the transmitter applying the offset PLL, there has been the limit of cost reduction because an external VCO with low noise is required.

An object of the present invention is to provide a direct-conversion transmitting circuit that does not require a low noise VCO having high performance and restricting the cost reduction in order to achieve reduction of the number of parts thereof, and that does not require an expensive and external high frequency filter such as a surface acoustic wave (SAW) filter or the like.

An object of the present invention is also to provide a transmitter/receiver using a direct-conversion transmitting circuit.

In order to solve problems described above, a transmitting circuit according to the present invention has an element of a circuit that uses a direct-conversion requiring no transmission VCO, and that provides a low-pass filter with each of I and Q (hereinafter, referred to as IQ) input portions of a modulator for converting IQ signals to a RF signal in order to achieve noise reduction in receiving band. An integrated transmitting/receiving circuit according to the present invention uses this direct-conversion transmitting circuit in a transmitting circuit section thereof. Concrete descriptions will be made in the following embodiments.

DESCRIPTION OF THE PREFERRED EMBODIMENTS

Preferred embodiments of a direct-conversion transmitting circuit and an integrated transmitting/receiving circuit using the same according to the present invention will be described in detail below, with reference to the accompanying drawings.

First Embodiment

Figure 3:
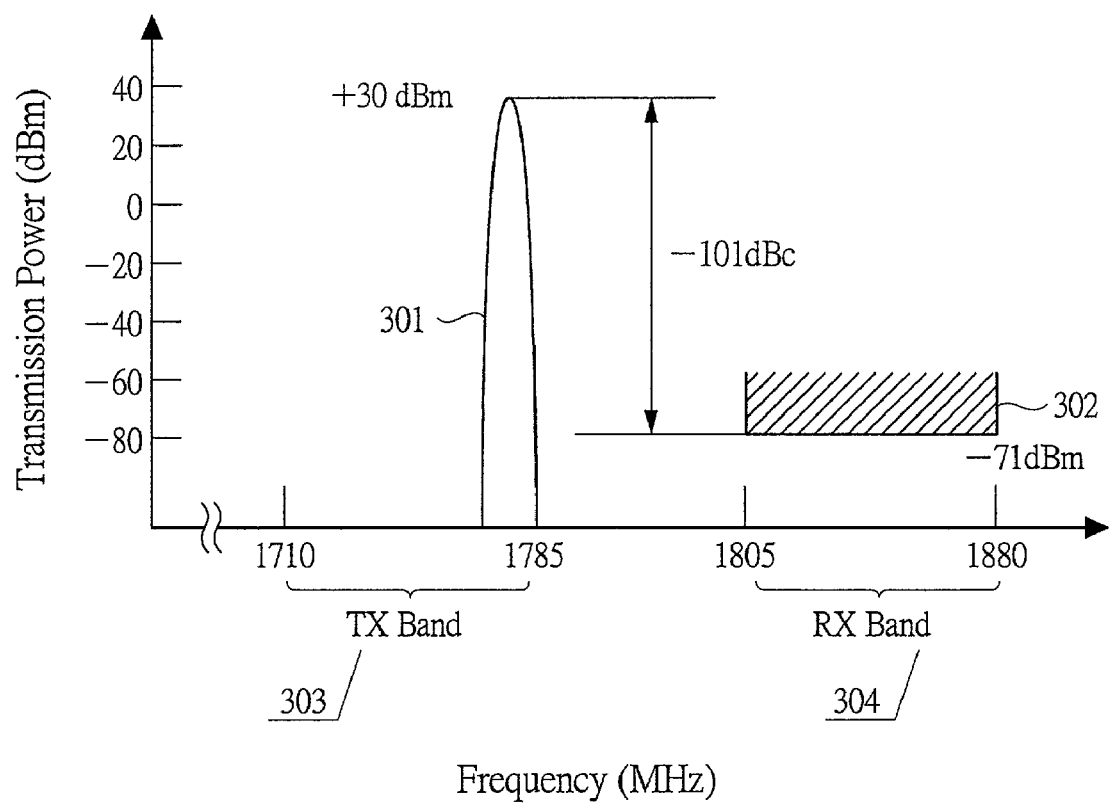
FIG. 3 is a view showing a relationship between transmission power defined by a GSM1800 specification and noises in receiving band.

A first embodiment of the present invention will be described with reference to FIGS. 1 to 8 and FIG. 19. In this embodiment, similarly to a conventional example, European cellular phone GSM (900 MHz band) and GSM1800 (1800 MHz band) are targeted as applications. Although there has already been given in the description of the conventional technique, a noise level from a transmitter within receiving band that the GSM specification should satisfy has been shown in FIG. 2. FIG. 3 shows conditions that the GSM1800 should satisfy. A transmission band (TX Band) 303 is within the range of 1710 to 1785 MHz, and a receiving band (RX Band) 304 is within a range of 1805 to 1880 MHz. Therefore, similarly to the case of the GSM, there is an interval of 20 MHz. It is required to suppress a noise of −71 dBm/100 kHz (−121 dBm/Hz) or less in order to satisfy an allowed spur level 302 in receiving band relative to a maximum transmission power of 30 dBm in an output signal 301 of the GSM1800. Thus, a level difference between the maximum transmission power 301 of the transmission signal and the noise in receiving band is −101 dBc as shown in FIG. 3. As compared with the GSM, this specification is reduced by 11 dB.

Figure 4:
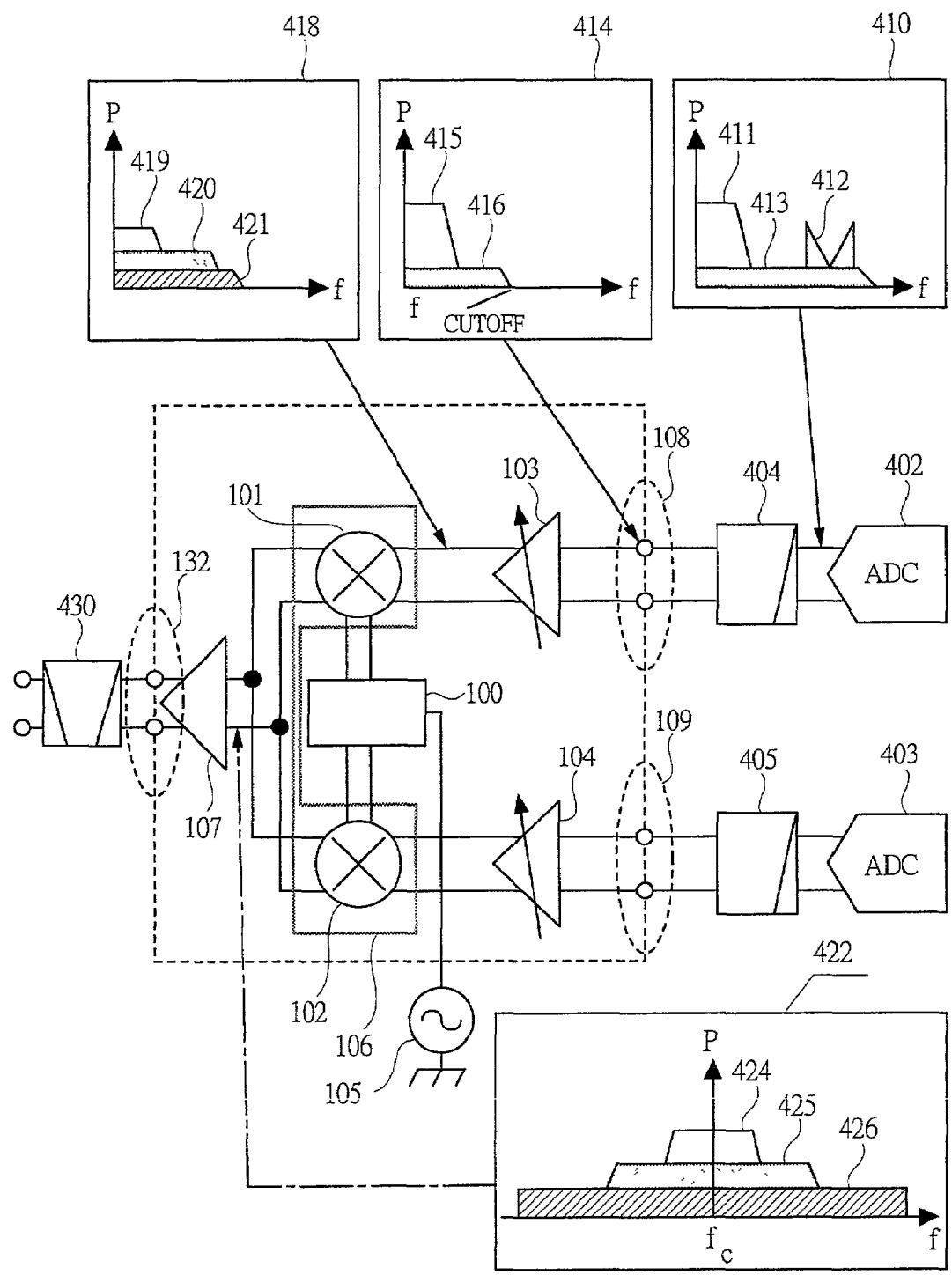
FIG. 4 is a view showing noise generation factors of a direct-conversion transmitter.

Here, problems, which arise in a direct-conversion transmitting circuit and should be solved, will be clarified with reference to FIG. 4.

Figure 18:
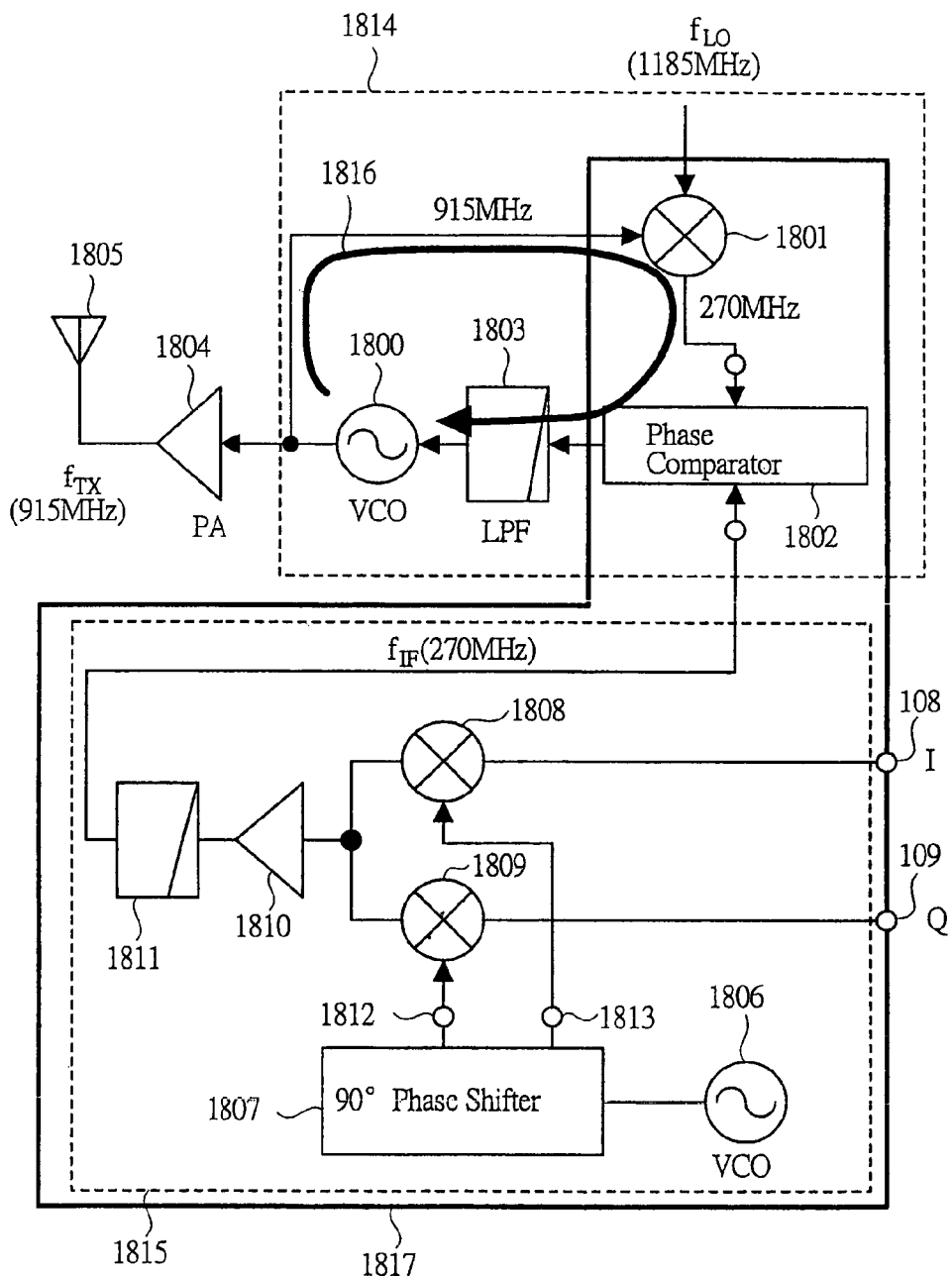
FIG. 18 is a circuit diagram of an important part showing a configuration of a conventional transmitter which uses an offset PLL circuit.

A direct-up-conversion transmitter has the same circuit constitution as the conventional IF section 1815 shown in FIG. 18, but a modulation method for directly generating a RF modulation signal is applied therein. Relative to the direct conversion, a direct-up-conversion means the case of executing a frequency conversion that straight increases a frequency from a baseband to a transmission frequency band, and a direct-down-conversion means the case of executing a frequency conversion that straight decreases a frequency from a receiving frequency band to a baseband.

In FIG. 4, AD converters (ADC) 402 and 403 generating respective IQ signals are also shown in addition to a modulation 106 constituted by mixers 101 and 102. As shown in a relation between frequency "f" and output "p", which is illustrated in a rectangle 410 and displays frequency characteristics of a signal/noise level of an output section in the AD converter 402, an output section of the AD converter 402 includes a signal body 411, a turn noise 412, and a thermal noise 413 which a circuit thereof has. An output section of the AD converter 403 also has the same characteristics as that of the AD converter 402.

In order to suppress the turn noise, low-pass filters 404 and 405 are installed at each output section of the AD converters. An output of the low-pass filter 404 is shown in a rectangle denoted by reference number 414, and suppresses a signal equal to or more than a cutoff frequency $f_{CUTOFF}$ of the low-pass filter 404, and includes a signal 415 and a noise 416 which is equal to or less than the cutoff frequency. The low-pass filter 405 also has the same output as the low-pass filter 404. Output signals of the low-pass filters 404 and 405 are applied to an I input 108 and a Q input 109 of the transmitting circuit, respectively. An optimal output signal amplitude of the AD converter is about 2 Vpp in normal differential. On the other hand, an optimal input level of the mixer depends on a circuit constitution and, for example, is 0.8 Vpp, and so is different from the output signal level of the AD converter. Besides, since optimal bias levels thereof are also different from each other, attenuators 103 and 104 each including a shift function of a bias level are required.

Since generating noises, an output of the attenuator 103 includes a signal 419, noise 420 equal to or less than the cutout frequency of the low-pass filter, and further a noise 421 generated by the attenuator as shown in a rectangle 418. The attenuator 104 also has the same output as the attenuator 103.

Each noise of the attenuators 103 and 104 extends within a wide band. In the mixers 101 and 102, the IQ signals containing noises are converted into RF frequencies that each regard a carrier frequency "fc" as a center. Local signals having the same frequency as the carrier frequencies whose a phase difference is 90° and which have the same frequencies are applied to two mixers 101 and 102. Each local signal is generated by a phase shifter 100 in accordance with an output of an oscillator 105. As typical phase shifters, there are two types of one using a CR filter and one using a frequency divider. However, in the case of one using the frequency divider, an oscillation frequency of the oscillator 105 is twice as high as the carrier frequency.

An output of the modulator 106 composed of the mixers 101 and 102 becomes a signal modulated in both sides by regarding the carrier frequency "fc" as a center, as indicated in rectangle 422. This modulation signal includes a modulator output signal 424, and a thermal noise 425 caused by the AD converter for a modulator output, and a noise 426 caused by the attenuator for a modulator output. In particular, the noise 421 of the attenuator extends within a wide band, and the modulated noise also exists as the noise 426 caused by the attenuator in a wide band.

A modulation signal is further amplified by a driver amplifier 107, and is output via an output terminal 132. This signal includes a wide band noise therein. Thus, in order to reduce a noise within a receiving band which is 20 MHz distant from a transmission band, a high frequency (RF) filter 430 which has a rapid waveform characteristic and which applies a SAW (surface acoustic wave) device, dielectric resonator, or the like is required.

Figure 1:
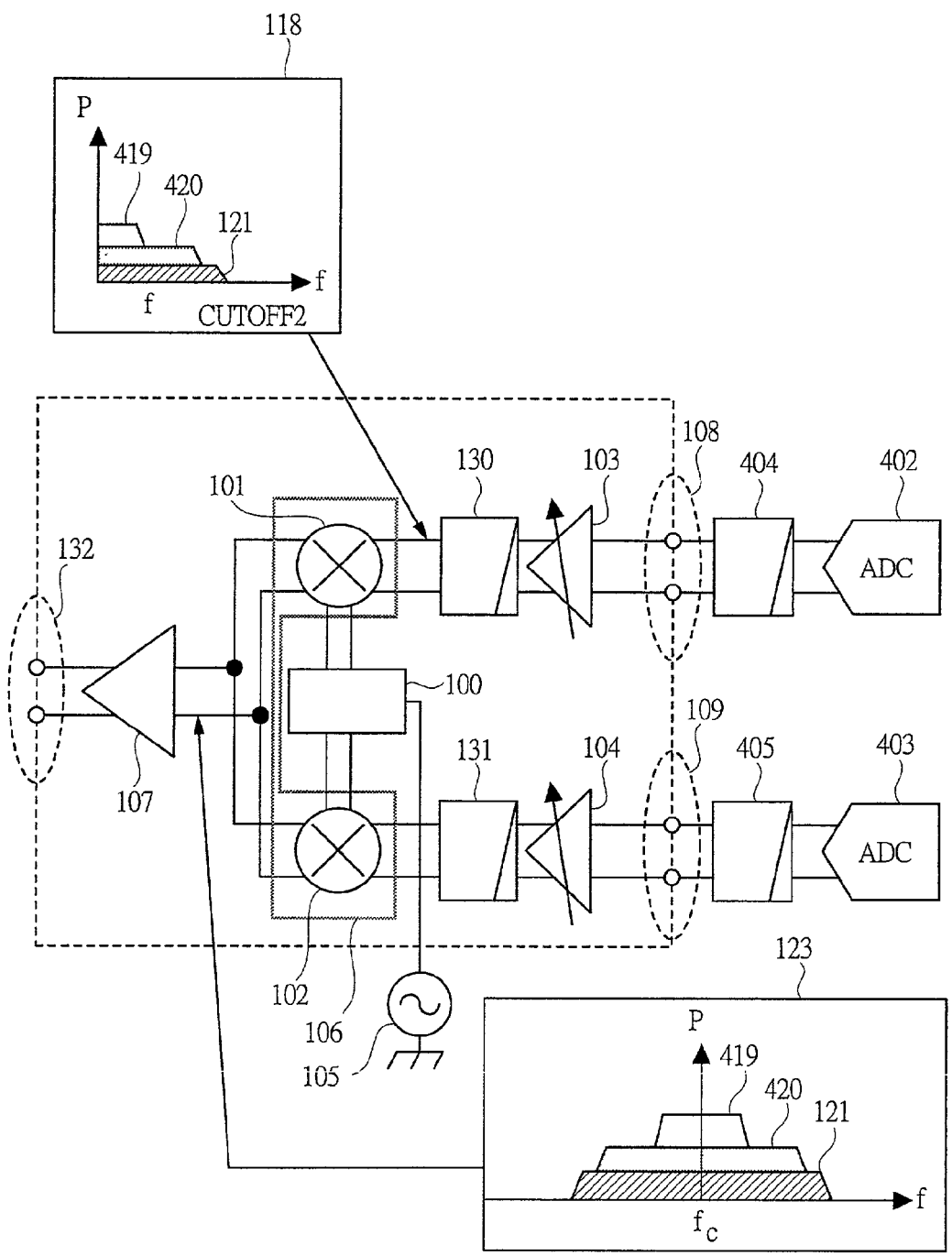
FIG. 1 is a configurational view showing an embodiment that is a direct-conversion transmitting circuit according to the present invention.
Figure 2:
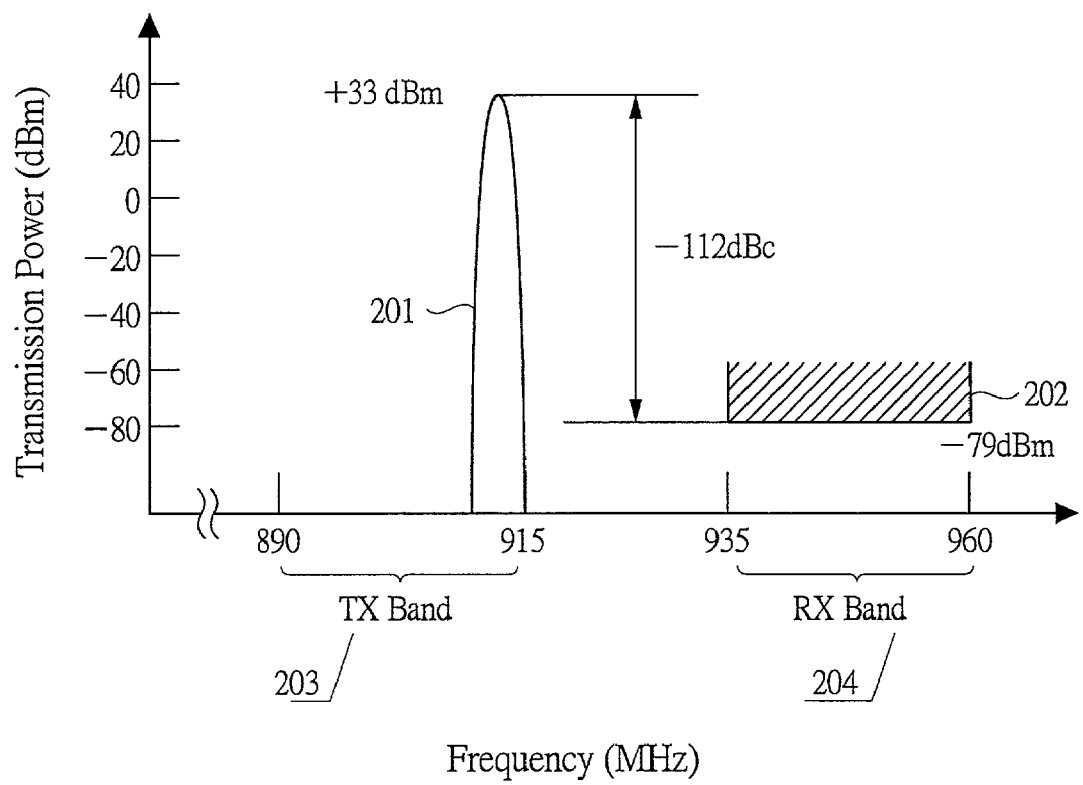
FIG. 2 is a view showing a relationship between transmission power defined by a GSM specification and noises in receiving band.

In order to eliminate the high frequency filter, it is required to reduce a wide band noise each generated by the attenuators 103 and 104. Due to this, as shown in FIG. 1, low-pass filters 130 and 131 are provided between the attenuators and the mixers 101 and 102, respectively. In FIG. 1, the outputs of the AD converters 402 and 403, and the noises included in signals reaching the IQ input terminals 108 and 109 are the same as the example shown in FIG. 4. That is, the output of the AD converter 402 contains a signal body 411, a turn noise 412, and a thermal noise 413 that the circuit has, as shown in the rectangular 410 of FIG. 4. As indicated in the rectangle 414 of FIG. 4, signals in the IQ input terminals 108 and 109 contain the signal body 415, and the noise 416 equal to or less than the cutoff frequency $f_{CUTOFF1}$ of the external low-pass filters 404 and 405.

In the attenuators 103 and 104, similarly to the example shown in FIG. 4, a wide band noise is generated, and the noise having a frequency equal to or more than a cutoff frequency $f_{CUTOFF2}$ is damped by a low-pass filter having the cutoff frequency $f_{CUTOFF2}$ connected immediately before the mixers 101 and 102, as indicated in a rectangle 118 of FIG. 1, and thereby the wide band noise caused by the attenuator becomes a noise 121 equal to or less than the cutoff frequency $f_{CUTOFF2}$. Thus, an output of the modulator 106 composed of the mixers 101 and 102, as indicated in a rectangle 123, becomes a signal modulated in both sides by regarding the carrier frequency "fc" as a center, but the noise level becomes small which is a frequency equal to or more than $f_{CUTOFF2}$ distant from the center carrier frequency "fc" in the modulated RF signal. Therefore, it is possible to reduce the noise level in receiving band without adding, to the RF output 132, an RF filter 430 shown in FIG. 4.

Figure 8:
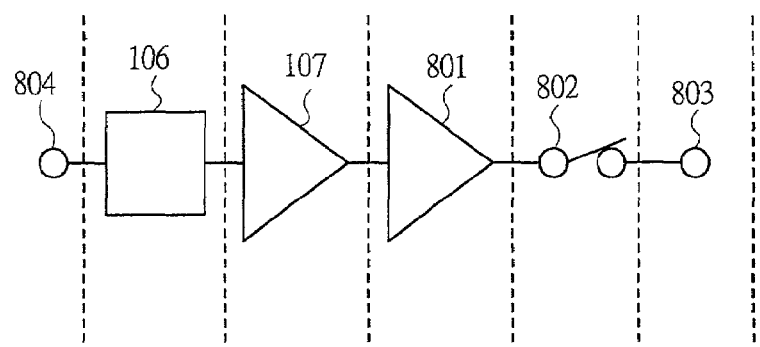
FIG. 8 is a level diagram showing a transmitter of a first embodiment that is the present invention used as an example of a GSM1800.

FIG. 8 shows an example of a level diagram of a transmitter that satisfies the specification of a GSM1800. The transmitter is composed of the modulator 106, the driver amplifier 107, a power amplifier 801, and a front end circuit (FEM) 802 constituted by switches or the like. In FIG. 8, reference number 804 denotes an input end of the transmitter, and reference number 803 denotes an output end of the transmitter. The respective gains of the driver amplifier 107, power amplifier 801, and front end circuit 802, and performance of a noise index NF are estimated from a circuit existing currently so as to have characteristics capable of being realized. In the case where an output signal level of the modulator 106 is −8 dBm, it is understood that the noise level in receiving band at the input end 804 of the transmitter satisfies the specification of the GSM1800 when being −160 dBm/Hz (−152 dBc) or less.

Figure 19:
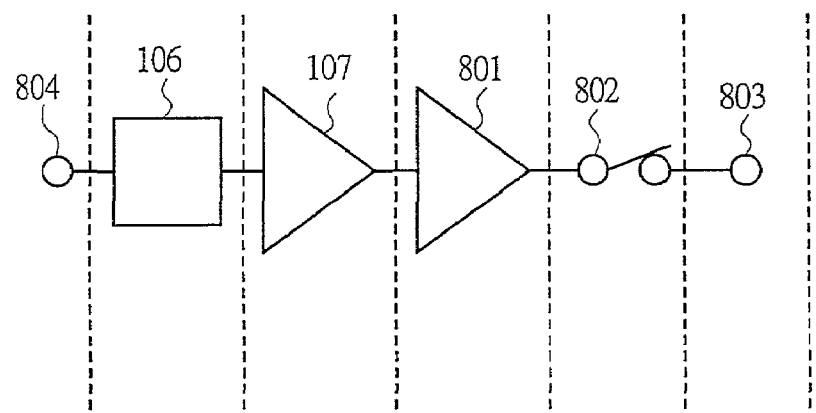
FIG. 19 is a level diagram of a transmitter according to a first embodiment of the present invention that uses a GSM as an example.

Specification of the case of the GSM is shown in FIG. 19, similarly to FIG. 8. As the frequency is lower, it is expected that each noise index NF of the driver circuit 107 and the power amplifier 801 is reduced. However, since the specification is strict, it is necessary that the noise level in receiving band is made −171 dBm/Hz (−166 dBc) or less when the modulator 106 has an output of −5 dBm.

Figure 5:
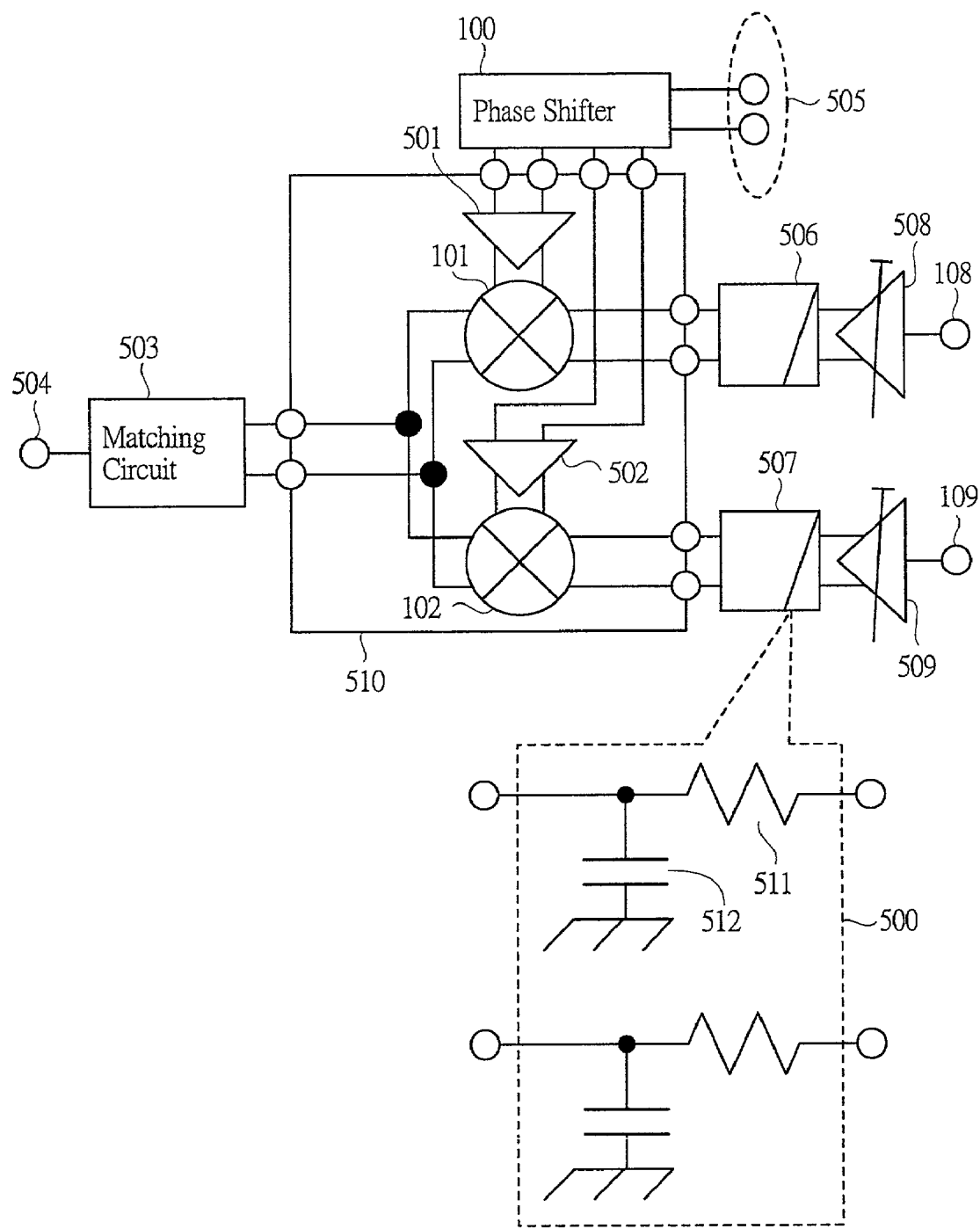
FIG. 5 is a trial manufacture circuit diagram used for checking effects of the present invention.

In order to make performance checks on a direct-up-conversion transmitting circuit adopted in the present embodiment, the circuit shown in FIG. 5 has been manufactured for trial by a Bi-CMOS process in which a transistor cutoff frequency "$f_T$" is 20 GHz at a rule of 0.35 μm, and evaluation thereof has been executed. The circuit manufactured for trial is a portion of a modulator 510 composed of: a group of IQ signal mixer circuits having the mixers 101 and 102; and buffer amplifiers 501 and 502 that amplify a mixer local signal being input from an input terminal 505 of a 90° phase shifter 100. The 90° phase shifter 100, the attenuators 508 and 509, and the low-pass filters 506 and 507 are composed of individual parts. Each of the filters 506 and 507 is a first order low-pass filter, and is composed of a resistor 511 and a capacitor 512 as shown in the circuit diagram in a dotted line denoted by reference number 500. A matching circuit 503 composed of individual parts is provided at an output end of the modulator 510, and is constituted to fetch a transmission signal from an output terminal 504 after a 50 Ω alignment and a differential-single conversion are carried out.

Figure 6:
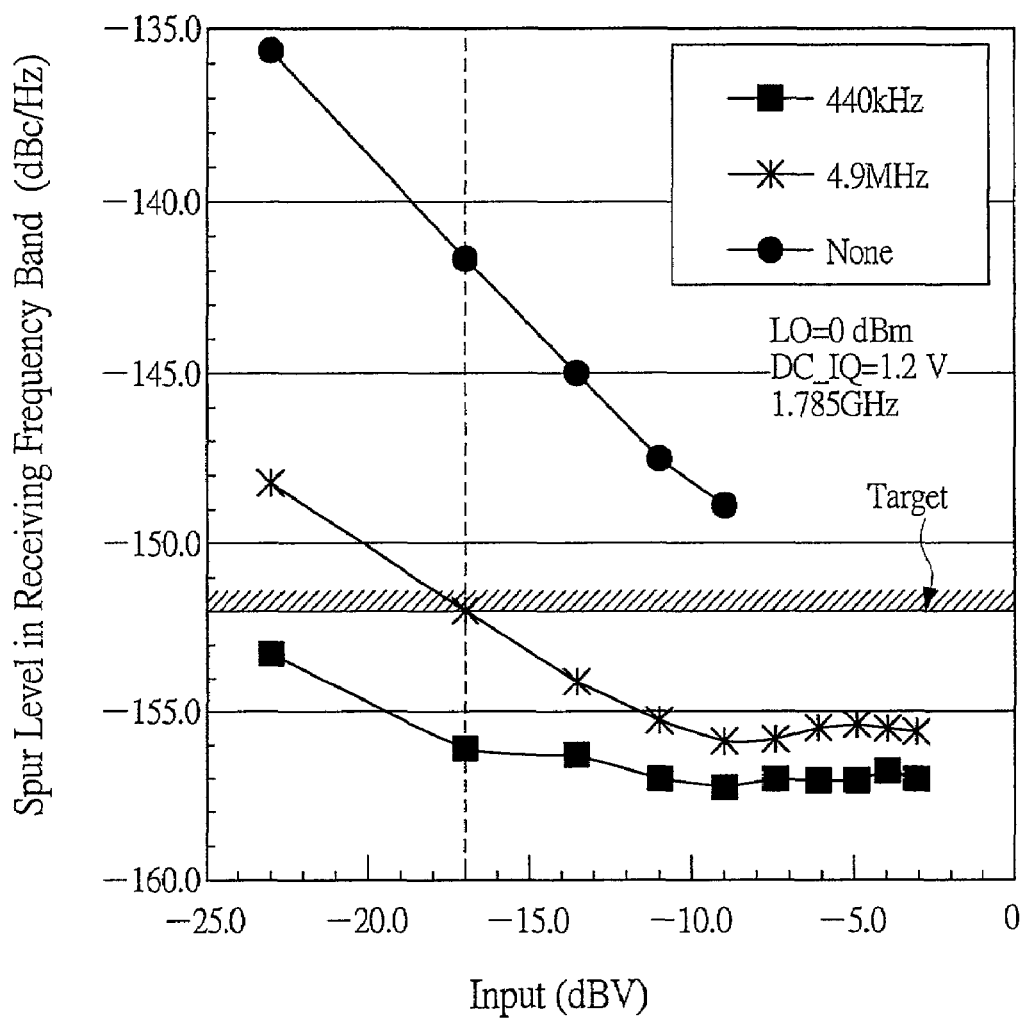
FIG. 6 is a characteristic-wiring diagram between an input signal level and a noise level showing measurement results of the circuit shown in FIG. 5.

In order to investigate effects of a low-pass filter in a direct-up-conversion transmitting circuit proposed in the present embodiment, evaluation oriented to a GSM1800 has been carried out about the case of no use of a filter and the case where the filter has cutoff frequencies of 4.9 MHz and 440 kHz. FIG. 6 shows evaluation results obtained when a local signal (L0) has an input level of 0 dBm, each IQ input signal has a DC level of 1.2 V, and an output has a frequency of 1.75 GHz. An abscissa denotes a voltage level (dBV) of each IQ input signal, and a vertical axis denotes a ratio between a transmission signal and a noise in receiving band. In this figure, a characteristic line indicated by a black filled circle denotes noise characteristics in receiving band, in the case of no use of filter. A characteristic line indicated by a square denotes the case where a filter with a cutoff frequency of 440 kHz is used. A characteristic line indicated by asterisk "*" denotes noise characteristics in receiving band, in the case where a filter with a cutoff frequency of 4.9 MHz is used. The level of −17 dBV is an allowable maximum input level to satisfy strain specification included in a GSM, a GSM1800 and the like.

When the IQ input level is −17 dBV, an output thereof is −7 dBm. In comparison with respective characteristics under this case, the case of no use of filter has a level of −142 dBc/Hz (−149 dBm/Hz) while the case of use of a filter having a cutoff frequency of 440 kHz has a level of −156 dBc/Hz (−163 dBm/Hz). Therefore, it is understood that the case of use of a filter having a cutoff frequency of 440 kHz is improved by 14 dB. The similar results have been obtained even in the case of GSM transmission frequency band. In this trial testing, although performances relative to the GSM specification are insufficient, it is considered that improvement of device characteristics by use of a SiGe (silicon/germanium) bipolar transistor, and the like, can be achieved, and thereby effects of the present invention are expected.

Figure 7:
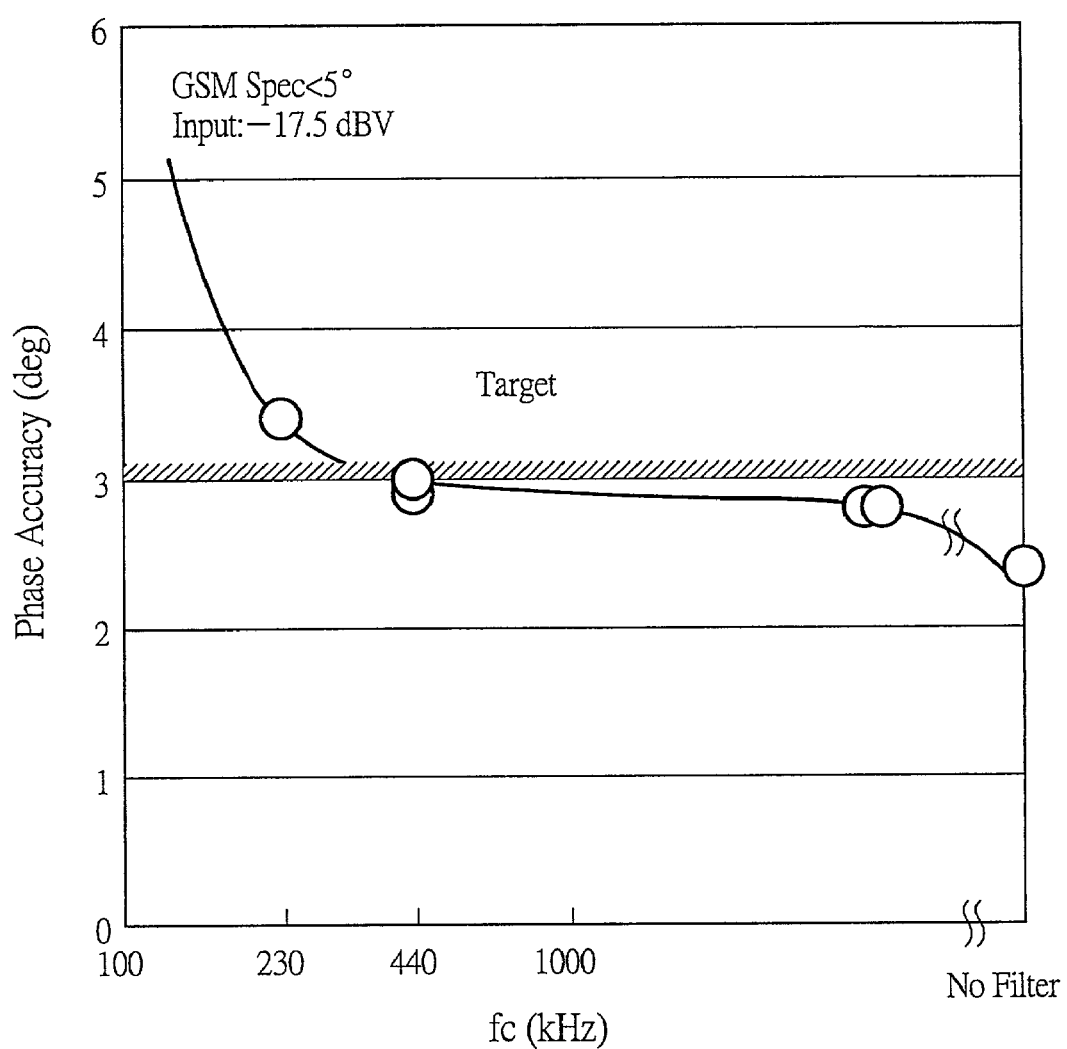
FIG. 7 is a characteristic-wiring diagram between a cutoff frequency and a phase precision of a filter showing the measurement result of the circuit shown in FIG. 5.

Although it is possible to reduce the noise level in receiving band by lowering the cutoff frequency of the filter, degradation of phase precision of a modulation signal is considered due to an affect of frequency characteristics of a group delay. FIG. 7 shows a relationship between the cutoff frequency of the filter and modulation signal of phase precision. The GSM specification has a phase precision of 5° or less, but if a target value of the phase precision is set at 3° on the basis of a margin thereof, sudden degradation is observed at the cutoff frequency of about 300 kHz or less. Therefore, a phase precision of 3° regarded as the target value cannot be satisfied. Assuming that dispersion of resistance values of the integrated circuit is ±20% and dispersion of capacitance values thereof is ±30%, it is desired that a design value of the cutoff frequency has lower limit of about 500 kHz.

As described above, according to the constitution of the first embodiment that is the present invention in which a low-pass filter is connected immediately before the IQ inputs of each mixer circuit constituting a direct-up-conversion transmitting circuit, it is understood that the spur level in receiving band for an output can be eminently improved.

Second Embodiment

A second embodiment of the present invention will be described with reference to FIG. 9 and FIG. 10. In an example of the first embodiment described above, there is shown characteristics of the case where the first order filter is connected immediately before the mixer. Although it is desirable that the cutoff frequency is lowered to reduce noise in receiving band, such noise reduction is limited because the phase precision is affected by a group delay deviation which the filter has. Thus, in the present embodiment, an attempt is made to ensure damping quantity in receiving band and suppression of the group delay deviation in signal band by using a high order filter.

Figure 9A:
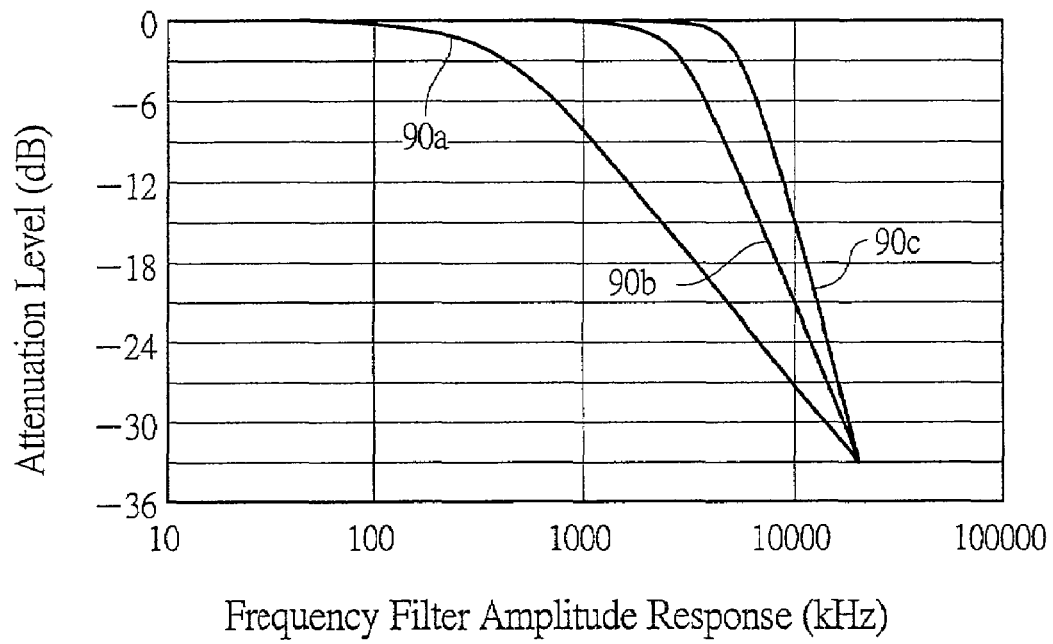
FIG. 9A is a view showing amplitude response of a first and second filters.

FIG. 9A shows respective amplitude characteristics of a first order low-pass filter 90a, a second order Butterworth filter 90b, and a third order Butterworth filter 90c. The characteristics of the first order low-pass filter in the cutoff frequency is 440 kHz, wherein the first order low-pass filter is set under the same conditions as the testing results which is indicated by asterisks "*" shown in FIG. 6 and which is carried out for checks on the first embodiment. The damping quantity at 20 MHz of the first order low-pass filter is about 33 dB. Each damping quantity of the second order and third order Butterworth filters 90b and 90c is also set to have a value of 33 dB at 20 MHz.

Figure 9B:
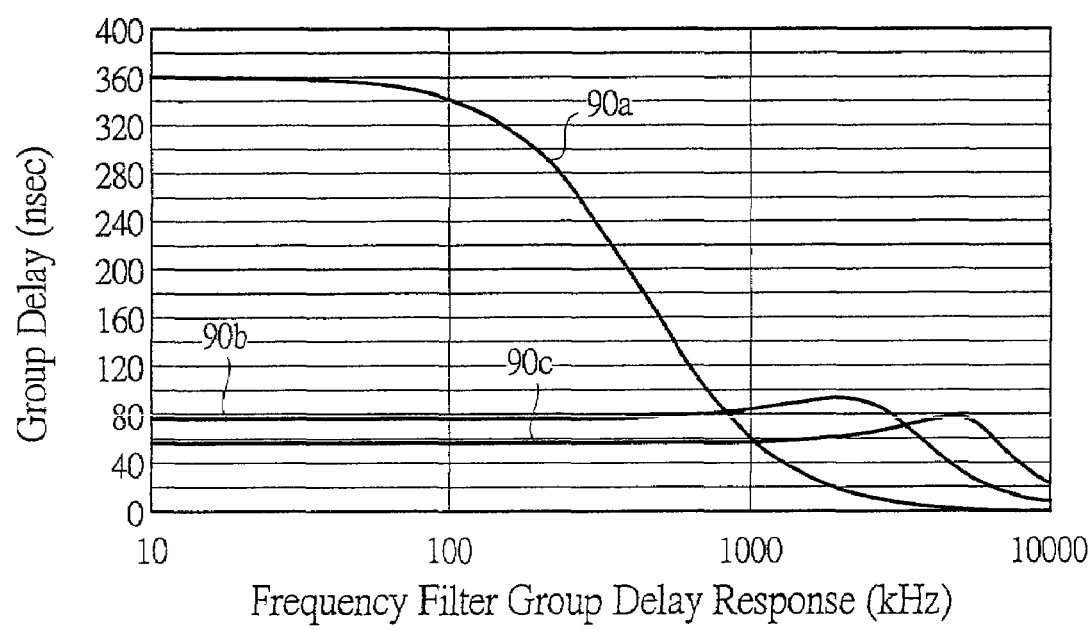
FIG. 9B is a view showing group delay response of a first and second filters.

FIG. 9B shows group delay characteristics of respective filters. The GSM signal band is about 100 kHz. In the characteristics of the first order filter 90a, a group delay deviation is 20 nsec within a band from 0 KHz to 100 KHz. An error of 1° in a signal of 100 kHz corresponds to 28 nsec, and so, in the case of use of the first order filter 90a, a deviation of about 0.7° occurs in a band of 100 kHz. Since spectrums of the GMSK modulation signal used in the GSM system are not uniform in a band of 100 kHz, this deviation is not equal to an absolute value of phase precision of the signal. However, the case of no filter as indicated by the testing results shown in FIG. 7 is well coincident with degenerative amount of phase errors of the case of using the first order filter having a cutoff frequency of 440 kHz. In the characteristics of the second order and third order Butterworth filters 90b and 90c, both group delay deviations thereof are below 0.1 nsec, and so this does not affect the phase deviation thereof. Therefore, in the case of changing filter order from a first order to a second order or more, it is found that eminently improved effects are attained.

Figure 10:
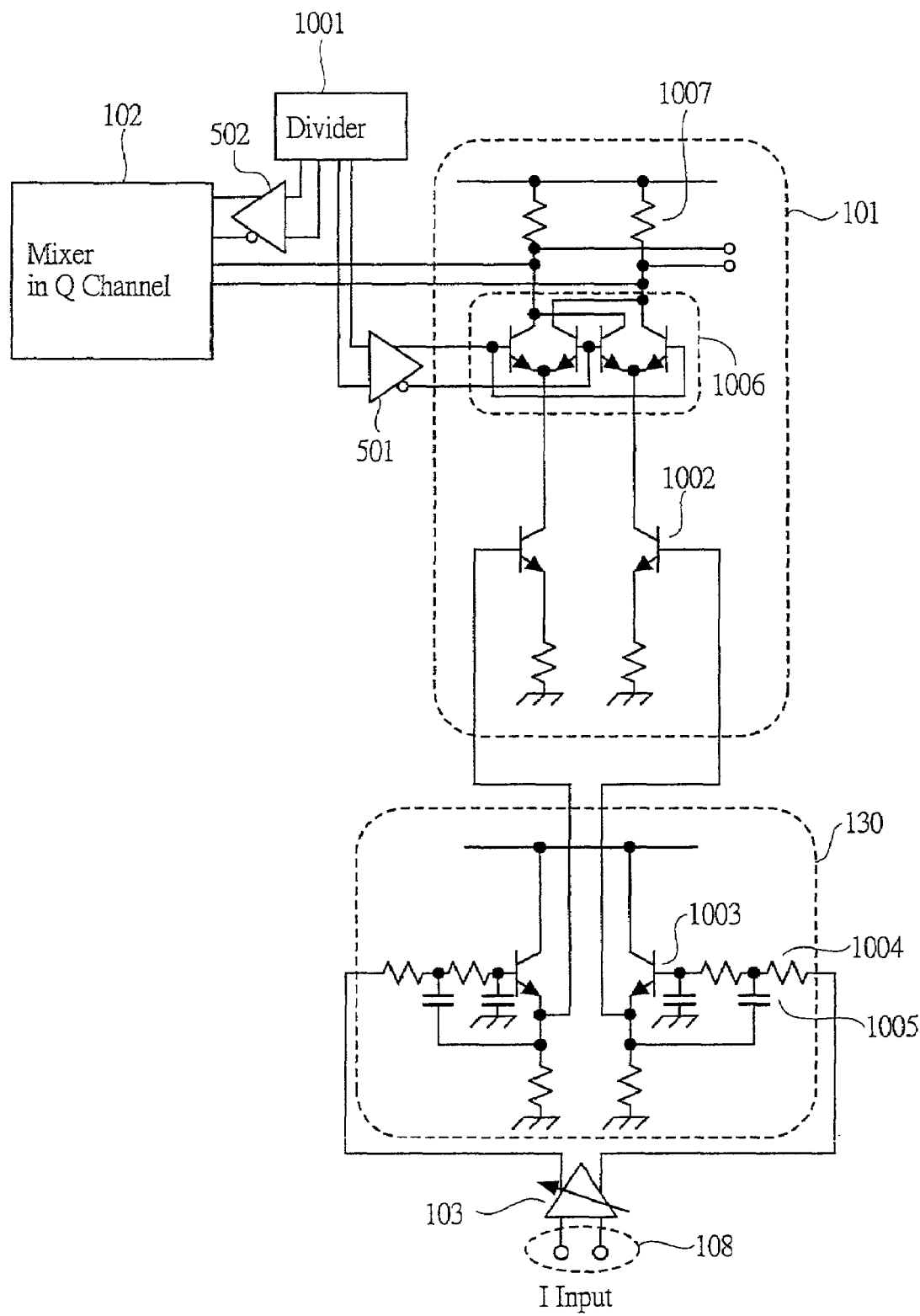
FIG. 10 is a configurational view of a mixer circuit using a second filter showing a second embodiment of the present invention.

FIG. 10 shows a concrete example of a circuit constitution. The mixers 101 and 102 are Gilbert type mixers widely known. Here, an I system circuit will be described in detail, and a description of a Q system circuit will be omitted because the Q system circuit is the same as the I system circuit. A local signal having a phase difference of 90° is generated at a phase shifter 1001 composed of a frequency divider. After the local signal has been amplified at a buffer amplifier 501, two groups of differential pairs 1006 which do switching operation in the Gilbert mixer circuit 101 are driven. An I signal input 108 is damped at the attenuator 103, and an input noise of 20 MHz or more is suppressed at a second order Sallen-Key type active low-pass filter 130 composed of a feedback transistor 1003, a resistor 1004, and a capacitor 1005.

The Sallen-Key filter can be composed of a Butterworth type filter or a Chabyshev type filter by selecting an element value. The filter output drives a mixer input stage transistor 1002, and is converted into a high frequency signal by means of two groups of differential pairs 1006, and is fetched from respective connection ends between load resistances 1007 and the differential pairs 1006 of a mixer. Here, although the second order filter is shown, the third order filter can easily be used instead of the second order filter. However, as far as the GSM system is concerned, as is evident from FIG. 9, necessary and sufficient characteristics can be obtained by the second order Butterworth type filter. By the present embodiment, the direct-up-conversion transmitter capable of suppressing band free noises and reducing phase errors can be achieved.

Third Embodiment

Figure 11:
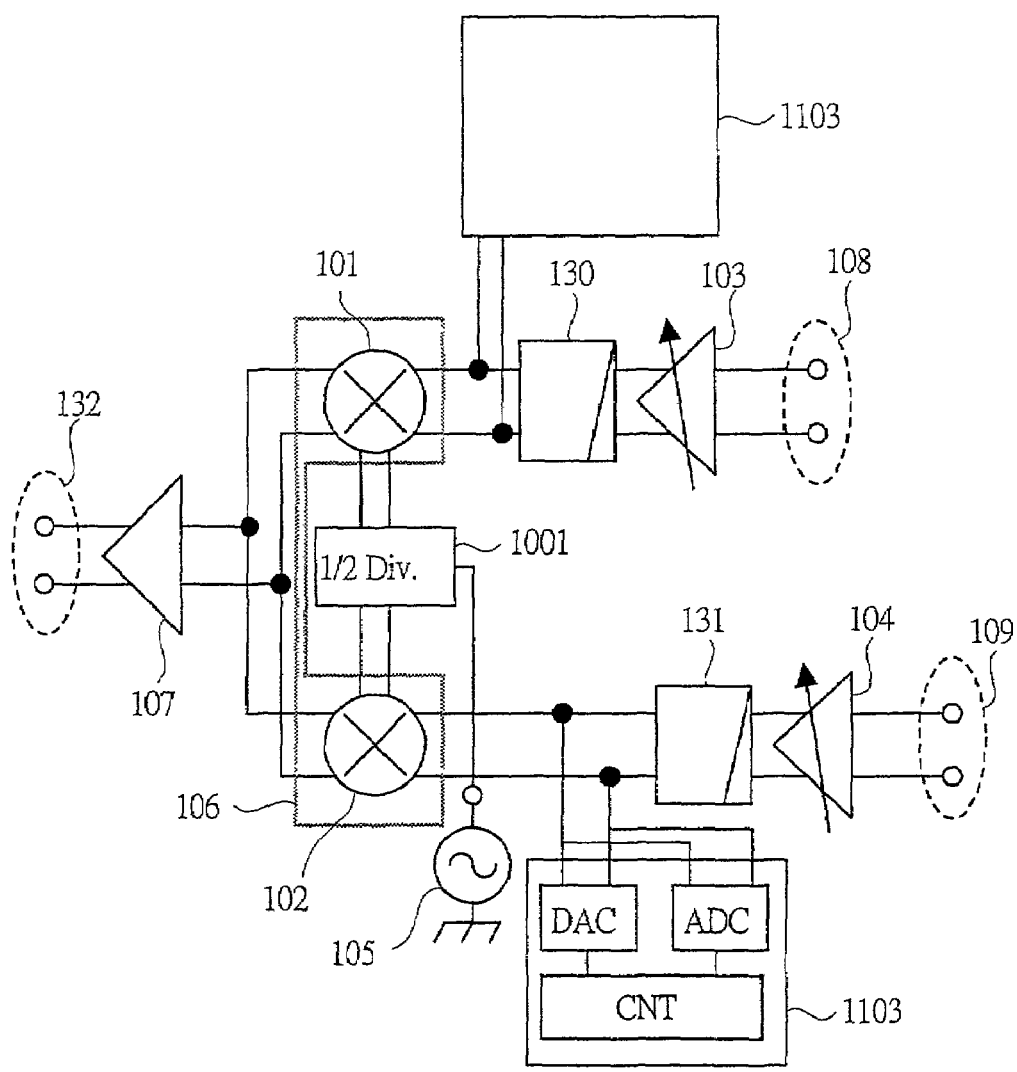
FIG. 11 is a view showing a third embodiment of the present invention, and is a circuit configurational view provided with a function of correcting a DC offset of a mixer constituting a modulator.

A third embodiment of the present invention will be described with reference to FIG. 11. The same components as FIG. 1 are denoted by the same reference number as FIG. 1. The present embodiment relates to reduction of a carrier leak generated by an effect of a DC offset of a mixer circuit input in respective circuit constitutions of the first and second embodiments described above. In a direct-conversion transmitting circuit that is the present invention, since many circuits such as a filter, a attenuator and the like are connected to a mixer input, increase in a DC offset generated at a mixer input terminal is considered. As a countermeasure thereof, a circuit constitution of the present embodiment is proposed.

First, a mixer carrier leak will be described here. This mixer functions as a multiplier. As shown in formula (1), a modulation wave fc(t) is generated by multiplying a baseband input signal f(t) and a local signal $\cos(2\pi fc)$.

$$fc(t)=f(t) \times \cos(2\pi fc) \quad (1)$$

When a DC offset α is added to the mixer input, as shown in formula (2), a single term of a carrier signal is generated and this causes degradation of modulation precision.

$$fc(t)=f(t) \times \cos(2\pi fc)+\alpha \cos(2\pi fc) \quad (2)$$

In order to correct the DC offset, in the present embodiment, respective channels of the I and Q are provided with a bias correction circuit 1103 consisting of an AD converter ADC for detecting an offset, a DA converter DAC for generating a correction bias, and a control section CNT which carries out control for minimizing an offset and simultaneously stores correction conditions. Correction is carried out within time from supply of power to beginning of transmission. The control section CNT is composed of a control register and a logic circuit and the like. By the present embodiment, a direct-up-conversion transmitter reducing an effect of a DC offset can be achieved.

Fourth Embodiment

Figure 12:
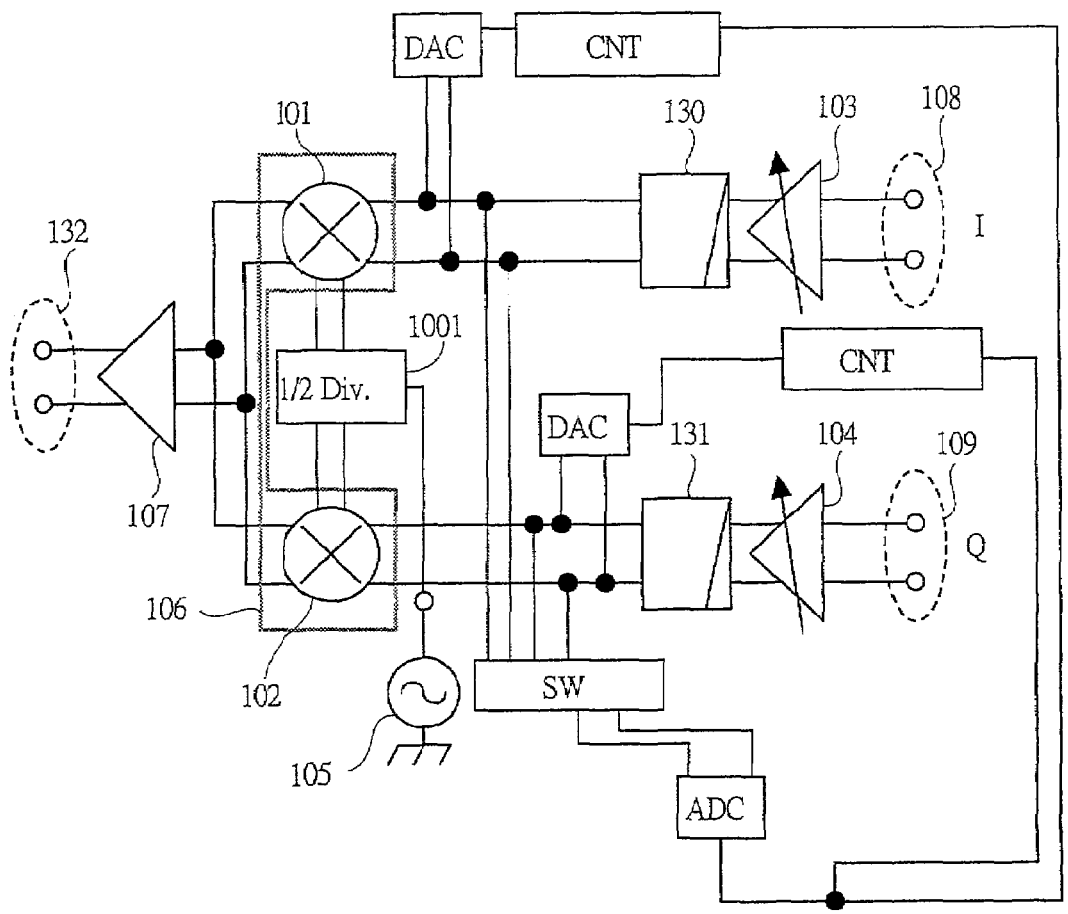
FIG. 12 is a view showing a fourth embodiment of the present invention, and is a configurational view reducing the use number of AD converters for DC offset correction.

A fourth embodiment according to the present invention will be described with reference to FIG. 12. The same components as FIG. 11 are denoted by the same reference number as FIG. 1. In the third embodiment described above the DC offset correction circuit 1103 has been provided separately from the I and Q while in the present invention AD converters ADC whose each circuit scale become large are shared with the I and Q and thereby the entire circuit scales are reduced.

The AD converter ADC is selectively connected to the I and Q signal lines by means of a switch SW. The DA converter DAC is provided exclusively for each of the I and Q signal lines. The control section CNT is also provided exclusively for each of the I and Q signal lines, and thereby each of the DC offsets is independently controlled. Since correction cannot be made for the I and Q simultaneously, correction time of the present embodiment is required about twice further than that of the third embodiment. By the present embodiment, a direct-up-conversion transmitter reducing an effect of the DC offset can be achieved with a small circuit scale.

Fifth Embodiment

Figure 13:
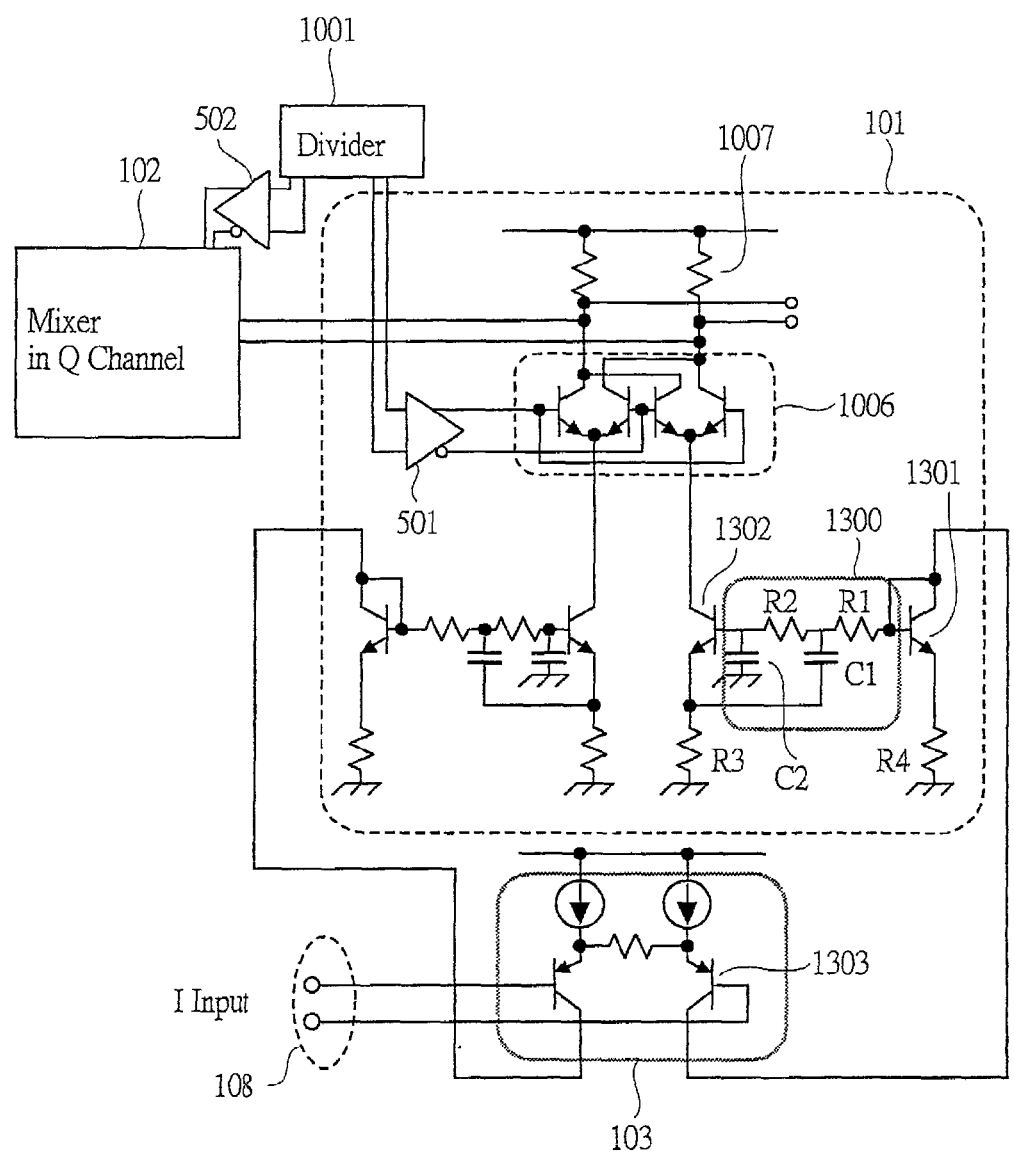
FIG. 13 is a view showing a fifth embodiment of the present invention, and is a circuit diagram of an important part of a configuration using a second order filter as input of a mixer section which constitutes a modulation section.

A fifth embodiment according to the present invention will be described with reference to FIG. 13. The same components as FIG. 10 are denoted by the same reference number as FIG. 10. In the second embodiment shown in FIG. 10, the active low-pass filter 130 and the mixer 101 have been constituted as independent circuits, respectively. In contrast, in the present embodiment, respective functions of both the input transistor 1002 of the mixer and the emitter follower circuit transistor 1003 of an active low-pass filter 130, as shown in FIG. 10, are integrated with a transistor 1302 shown in FIG. 13. In this manner, it is possible to achieve a circuit which is not saturated even if a large baseband signal is applied thereto.

The I input signal 108 is converted to current from voltage at a differential input circuit composed of a PNP type transistor 1303. The transistors 1301 and 1302 each have a current mirror structure, and current is returned to two groups of differential pairs 1006 for mixer, and a mixer output is supplied from a connection end connected to each load resistor 1007. A low-pass filter 1300 is composed of resistors R1 and R2 connected in series to bases of the transistors 1301 and 1302, and capacitors C1 and C2 connected to a grounding terminal, and an emitter of the transistor 1302, respectively. In addition, emitters of the transistors 1301 and 1302 are grounded via resistors R3 and R4, respectively. By the present embodiment, it is possible to achieve a direct-conversion transmitter capable of corresponding to a large baseband input signal.

Sixth Embodiment

Figure 14:
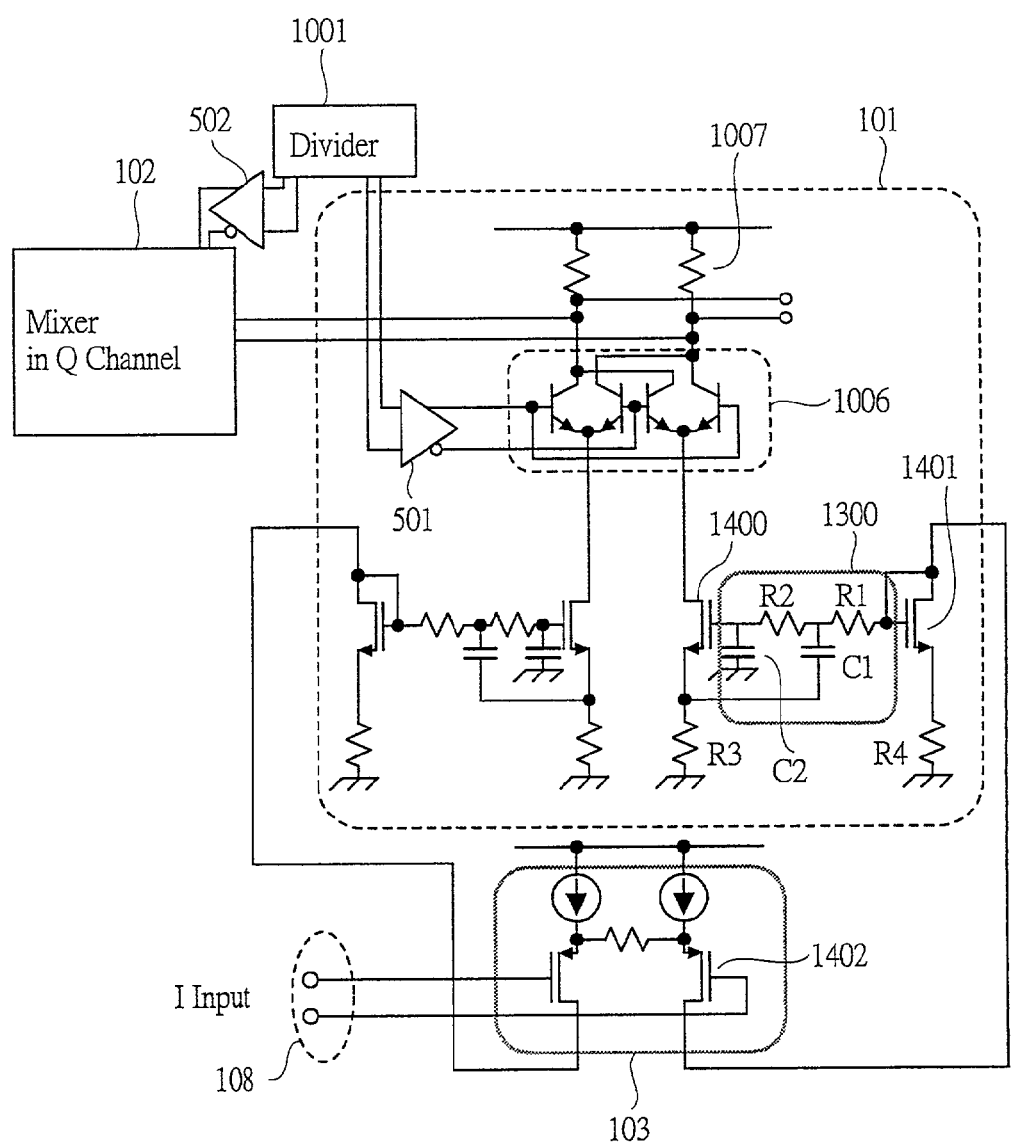
FIG. 14 is a view showing a sixth embodiment of the present invention, and is a circuit diagram of an important part of a configuration using a MOSFET as a second order filter provided for an input of a mixer section which constitutes a modulation section.

A sixth embodiment according to the present invention will be described with reference to FIG. 14. The same components as FIG. 10 are denoted by the same reference number as FIG. 10. In the fifth embodiment shown in FIG. 13, since the resistors R1 and R2 each constituting the filter are connected in series to bases of the transistors 1301 and 1302, increase in DC offset of a mixer input voltage is considered due to deviation of the base current caused by a base/collector current amplification rate "hFE" of each transistor.

In contrast, in the present embodiment, MOSFETs 1400 and 1401 each having a gate in which no DC current flows are applied to a current mirror section, and thereby generation of a DC offset caused by deviation of potential fall at the resistors R1 and R2 is suppressed. In addition, a transistor constituting the attenuator 103 is changed from the PNP transistor 1303 to a P type MOSFET 1402. This is because input impedances thereof are increased and driving thereof can be achieved by using small amount of power.

By the present embodiment, since a large resistor can be applied to a filter, capacitive value thereof can be reduced. As a result, a low noise direct-conversion transmitter having small element area can be achieved.

Seventh Embodiment

Figure 15:
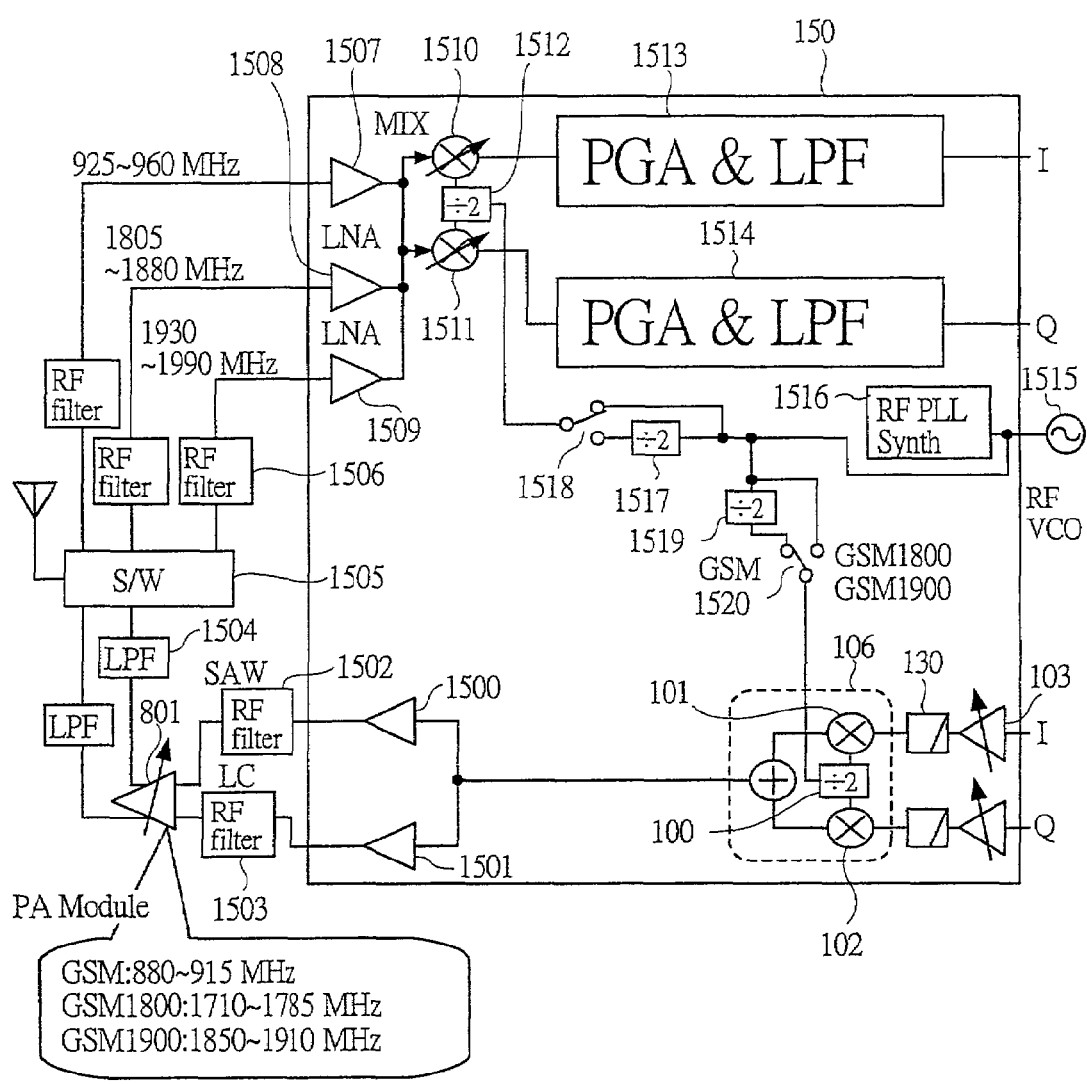
FIG. 15 is a view showing a seventh embodiment of the present invention, and is a circuit diagram of an important part showing a configuration of a transmitting/receiving integrally integrated circuit that corresponds to a GSM, GSM1800, and GSM 1900.

A seventh embodiment according to the present invention will be described with reference to FIG. 15. The present embodiment is a transceiver IC adopting direct-conversion and using transmission/reception that is applied to a triple band of GSM/GSM1800/GSM1900. A receiving circuit of this transceiver IC 150 receives frequency bands from 925 to 960 MHz, 1805 to 1880 MHz, and 1930 to 1990 MHz of the respective GSM/GSM 1800/GSM1900. A large interference wave other than each frequency band is erased by means of an external RF filter 1506. Therefore, the signal is amplified by low noise amplifiers 1507, 1508 and 1509 extensively provided relative to the respective frequency bands. Respective outputs of the low noise amplifiers are connected to an input of common direct-conversion mixers 1510 and 1511 operating in all the frequency bands, and the signals are directly converted into I and Q components of a baseband frequency. The mixers 1510 and 1511 are driven by means of local signals each having a 90° phase difference generated by a ½ frequency divider 1512. The signal having I and Q components are subjected to processing for eliminating interference waves and for gain regulation in baseband programmable gain variable amplifiers/channel low-pass filter rows (PGA & LPS) 1513 and 1514, and thereafter is output as I and Q signals in a downstream side of the circuit.

A transmitting circuit applies any of the embodiments introduced previously. The IQ transmission signals are adjusted to a desired signal level at the attenuator 103, and a wide band noise generated by the attenuator 103 is suppressed at the low-pass filter 130. The signals whose noises are suppressed at the filters 130 are converted into modulation signals having RF frequency, by the modulator 106 composed of a group of mixers 101 and 102. These mixers operate within respective ranges from 880 to 915 MHz in the case of GSM, from 1710 to 1785 MHz in the case of the GSM1800, and from 1850 to 1910 MHz in the case of the GSM1900. The mixers 101 and 102 each are driven by means of a local signal having a 90° phase difference generated by the frequency divider 100.

The output signal of the modulator 106 is amplified by a GSM driver amplification circuit 1500 or a driver circuit 1501 compatible with the GSM1800 and GSM1900. A band pass filter 1502 such as a SAW filter having rapid waveform characteristics, or the like is connected to an output of the GSM driver circuit, and thereby residual noise in receiving band which is 20 MHz distant is eliminated. Here, although the SAW filter having rapid waveform characteristics is connected to the GSM output in accordance with the testing results shown in the first embodiment, this filter can replace an inexpensive LC filter according to higher performance of the circuit. The output signal of the filter is amplified by a power amplifier module (PA module) 801.

A simple LC filter 1503 is connected to an output of the driver amplification circuit 1501 compatible with the GSM1800 and GSM1900, and the signal thereof is amplified by the power amplifier module 801 after high harmonics are eliminated. Here, the power amplifier module 801 packages the GSM modulator and the modulator compatible with the GSM1800 and GSM1900. The amplified signal is transmitted from an antenna via a low-pass filter (LPF) 1504 that eliminates high harmonics generated by an output of the amplifier in the power amplifier module 801, and via a transmission/reception changeover switch (S/W) 1505.

A voltage control oscillator (RF VCO) 1515 receives and constantly oscillates a feedback loop by means of a synthesizer (RF PLL Synth) 1516, and generates a transmission/reception signal as follows.

GSM reception: An oscillator 1515 oscillates within a range from 3700 to 3840 MHz. The output of this oscillator is frequency-divided into two sections by means of a frequency divider 1517, and further is frequency-divided into two sections by the frequency divider 1512. Thereby, a local signal for a GSM reception, which drives the mixers 1510 and 1511, is obtained.

GSM1800 reception: The oscillator 1515 oscillates within a range from 3610 to 3760 MHz. The output of this oscillator is directly connected to the frequency divider 1512 without passing through the frequency divider 1517, and is frequency-divided into two sections by a switch 1518. Thereby, the local signal for the GSM1800 reception, which drives the mixers 1510 and 1511, is obtained.

GSM1900 reception: The oscillator 1515 oscillates within a range from 3860 to 3980 MHz. The output of this oscillator is directly connected to the frequency divider 1512 without passing through the frequency divider 1517, and is frequency-divided into two section by the switch 1518. Thereby, the local signal for the GSM1900 reception, which drives the mixers 1510 and 1511, is obtained.

GSM transmission: The oscillator 1515 oscillates within a range from 3520 to 3660 MHz. The output of this oscillator is frequency-divided into two sections by means of a frequency divider 1519, and further is frequency-divided by means of the frequency divider 100. Thereby, a local signal for the GSM transmission, which drives the modulator 106, is obtained.

GSM1800 transmission: The oscillator 1515 oscillates within a range from 3420 to 3570 MHz. The output of this oscillator is directly connected to the frequency divider 100 without passing through the frequency divider 1519, and is frequency-divided into two sections by means of a switch 1520 without passing through a frequency divider 1519. Thereby, a local signal for the GSM1800 transmission, which drives the modulator 106, is obtained.

GSM1900 transmission: The oscillator 1515 oscillates within a range from 3700 to 3820 MHz. The output of this oscillator is directly connected to the frequency divider 100 without passing through the frequency divider 1519, and is frequency-divided into two sections by the switch 1520. Thereby, a local signal for the GSM1900 transmission, which drives the modulator 106, is obtained.

In order to make such operations, the oscillator 1515 operates within a range from 3420 to 3980 MHz. By the present embodiment, a direct-conversion circuit can be achieved for both of transmission and reception by using one voltage control oscillator.

Eighth Embodiment

Figure 16:
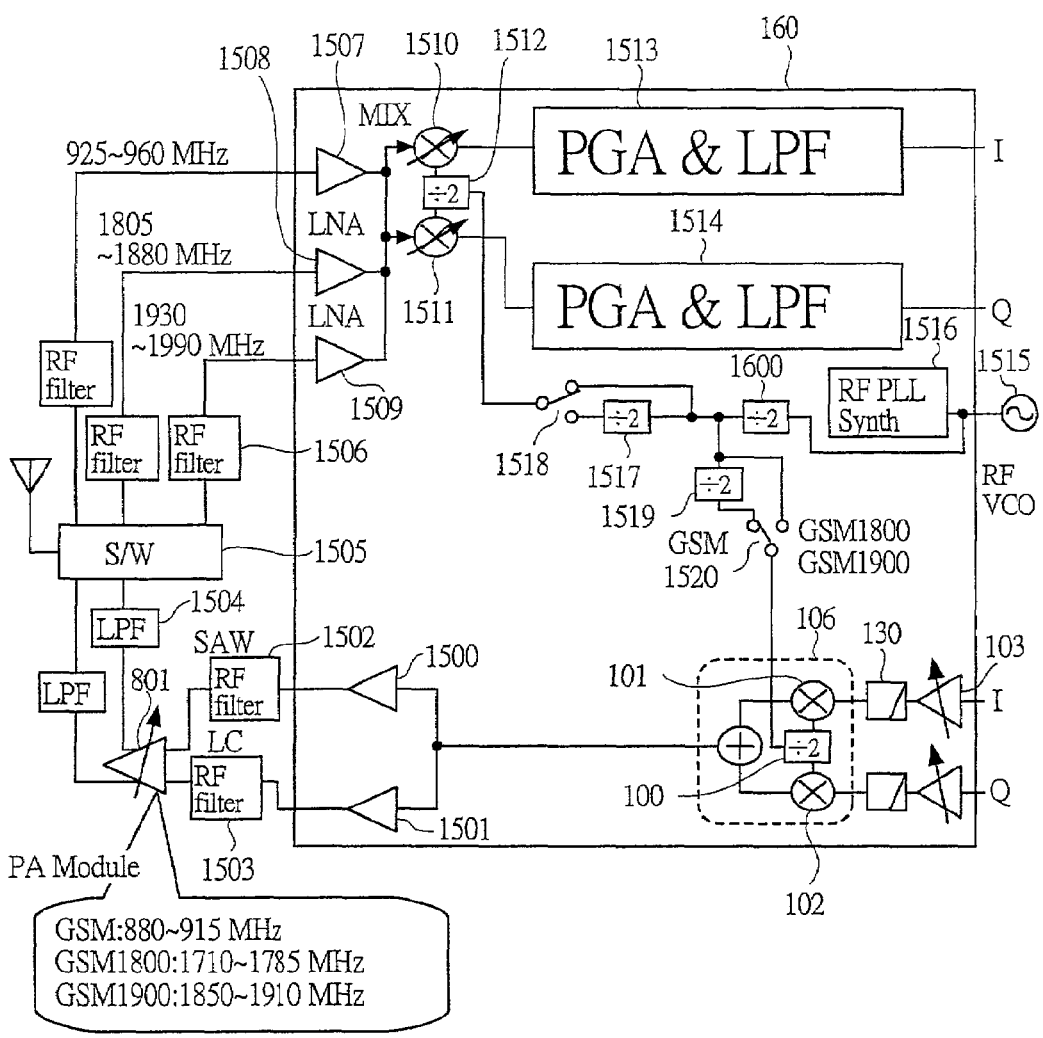
FIG. 16 is a view showing an eight embodiment of the present invention, and is a configurational view showing the case of having doubled an operating frequency of an oscillator in the circuit of FIG. 15.
Figure 20:
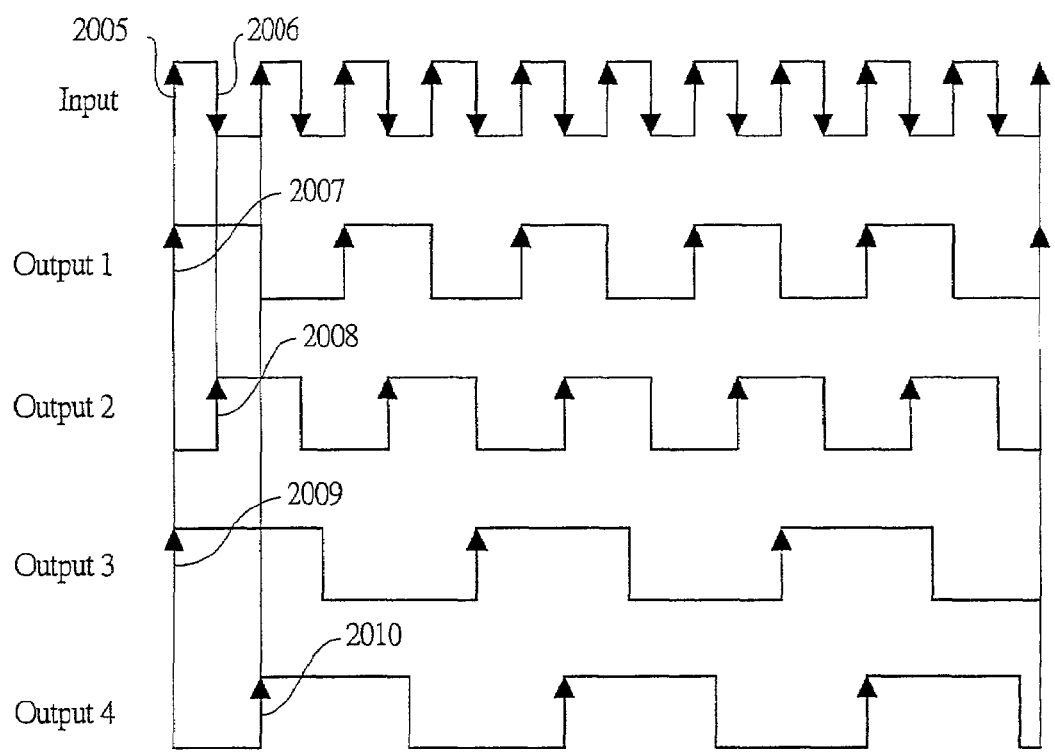
FIG. 20 is views showing an input waveform, a two-frequency division waveform and a four-frequency division waveform of two frequency dividers that are used for generating a local signal in the constitution of FIG. 16

An eighth embodiment according to the present invention will be described with reference to FIG. 16 and FIG. 220. In FIG. 16, the same components as FIG. 15 are denoted by the same reference number as FIG. 15. In the sixth embodiment described previously, the case of the GSM frequency-divides the output of the oscillator 1515 into four sections, and the cases of the GSM1800 and the GSM1900 each are frequency-divided into four sections and generate the local signal. FIG. 20 shows an input waveform, a two-frequency division waveform, and a four-frequency waveform of a two-frequency divider (i.e., an output waveform of the oscillator 1515).

When the output of the oscillator 1515 is inputted into the two-frequency divider, two waveforms of outputs 1 and 2 are generated. One of two rising edges 2007 and 2008 in the waveforms of the outputs 1 and 2 is synchronized with a rising edges 2005 of the input of the frequency divider (that is, the output of the oscillator), and the other is synchronized with a falling edge 2006 of the input of the frequency divider.

If the output of the oscillator 1515 has a duty ratio of 50%, a phase difference between these two outputs is 90°. In the case where the duty ratio is shifted from 50%, an error occurs in the phase difference. When the waveform of the output 1 is further frequency-divided into two sections, waveforms of outputs 3 and 4 are obtained. Rising edges 2009 and 2010 of any of the waveforms are also synchronized with the rising edge 2005 of the oscillator output, and a signal precisely having a phase difference of 90° phase difference can be generated without depending on the duty ratio of the oscillation waveforms.

Therefore, although a signal having a precise phase difference can be generated relative to the GSM in the sixth embodiment described above, there occurs each error depending on the duty ratio of the oscillation waveforms in the GSM1800 and the GSM1900. The transceiver IC 160 employing a direct-conversion for both of transmission and reception, which is applied to the triple band of the GSM/GSM1800/GSM1900 in the present embodiment shown in FIG. 16, is constituted in which the oscillation frequency of the voltage control oscillator 1515 is set within such a range from 6840 to 7960 MHz as to double the sixth embodiment, and a frequency divider 1600 is newly connected to the oscillator output. In this manner, by using eight-frequency division for the GSM and using four-frequency divisions for the GSM1800 and GSM1900, a local signal precisely having a phase difference of 90° can be generated without depending on the duty ratio of the oscillator waveforms.

Ninth Embodiment

Figure 17:
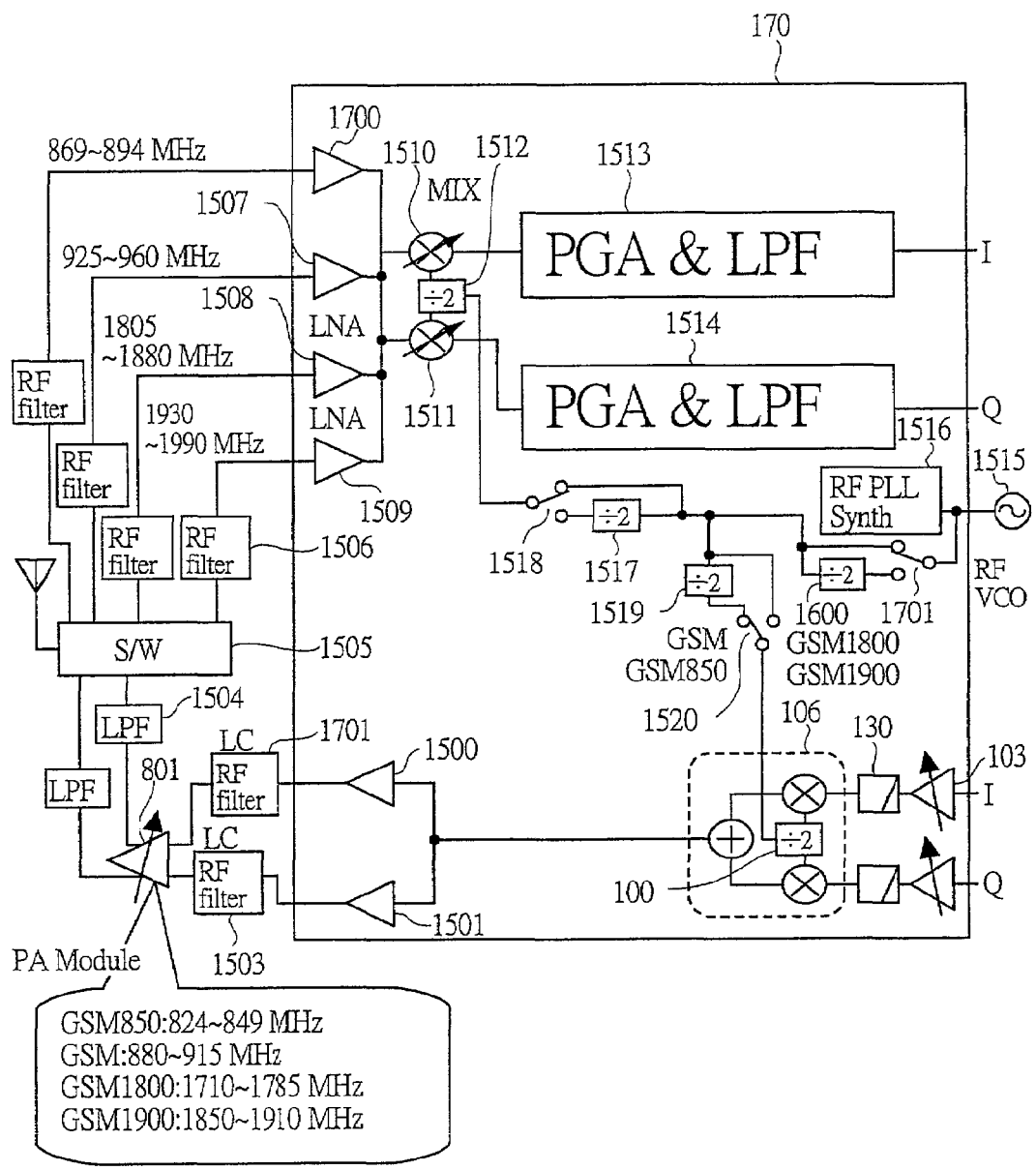
FIG. 17 is a view showing a ninth embodiment of the present invention, and is a circuit diagram of an important part showing a configuration of a transmitting/receiving integrally integrated circuit that corresponds to a GSM850, GSM, GSM1800, and GSM1900.

A ninth embodiment according to the present invention will be described with reference to FIG. 17 and FIG. 19. In FIG. 17, the same components as FIG. 15 are denoted by the same reference number as FIG. 15. The sixth and seventh embodiments described above has been the case of the triple band compatible ICs for the GSM, GSM1800 and GSM1900. In contrast, the present embodiment is the case a 4-band compatible transceiver IC to which a GMS850 is newly added. A low noise amplifier 1700 for receiving a range from 869 to 894 MHz has been added to a receiving circuit of this transceiver IC 170. In the transmitting circuit, a GSM exclusive driver circuit 1500 is actuated for signals of both of the GSM and GSM850. External RF filters for the GSM and GSM850 each are composed of an LC filter, and eliminates high harmonics. In order to use the GSM and GSM850 circuits in combination, during the GSM and GSM850 transmissions, the noise level in receiving band for the driver circuit output is required to satisfy a value of −160 dBm/Hz or less at an output of 3 dBm (see FIG. 19). In the case where the noise level does not meet this condition, there may be provided a construction in which the driver circuits 1500 compatible currently therewith are provided for each of the GSM and GSM850 to increases two systems, and an exclusive SAW filter is used for each of the systems.

By the present embodiment described above, a 4-band compatible transceiver IC can be achieved by using the small number of external elements.

As described above, several preferred embodiments of the present invention has been described. However, the present invention is not limited to these embodiments, and of course various design modifications thereof can be made without departing from the spirit of the present invention.

According to the present invention, in comparison with a conventional transmitter applying offset PLL, even if a required external VCO in addition to an RF integrated circuit, a power amplifier and a front end circuit is reduced and current transistor performance is maintained, then a GSM/GSM1800/GSM 1900 triple band transmitter/receiver can be achieved by using one filter having rapid waveform characteristics, such as a SAW or the like more inexpensive than the VCO. Further, by improving transistor characteristics, a triple band or quadrant band transmitter/receiver can be formed without using expensive external parts.

What is claimed is:

1. A direct-conversion transmitting circuit, characterized by a local modulation circuit comprising first and second mixers, and first and second low-pass filters, first and second gain/bias adjustment means, and a first phase shifter,
   wherein high frequency output terminals of said first and second mixers are connected to each other; an output terminal of said first low-pass filter is connected to an input terminal of said first mixer; the input terminal of said first low-pass filter is directly connected to an output terminal of said first gain/bias adjustment means; the output terminal of the second low-pass filter is connected to an input terminal of the second mixer; the input terminal of the second low-pass filter is directly connected to an output terminal of said second gain/bias adjustment means; a first output terminal of said first phase shifter is connected to a local signal input terminal of said first mixer; a second output terminal of said first phase shifter is connected to a local signal input terminal of said second mixer; and input signals are applied to an input terminal of said first gain/bias adjustment means and an input terminal of said second gain/bias adjustment means, respectively,
   wherein each circuit of said first and second low-pass filters is composed of a filter whose order is at least a second order, and
   wherein said first and second low-pass filter circuits are each composed of a Sallen-Key type filter circuit,
   the Sallen-Key type filter is composed of first and second resistors, first and second capacitors, and a first transistor, and
   a first terminal of said first resistor is an input of the filter; a second terminal of said first resistor is connected to a first terminal of said second resistor; a second terminal of said second resistor is connected to a base of the first transistor; a first terminal of said first capacitor is connected to the second terminal of said first resistor; a second terminal of said first capacitor is connected to an emitter of said first transistor; a first terminal of said second capacitor is connected to the second terminal of said second resistor; a second terminal of said second capacitor is connected to a grounding potential; a collector of said first transistor is connected to a power source potential; and an emitter of said first transistor is an output terminal of the filter.

2. A direct-conversion transmitting circuit, characterized by a local modulation circuit comprising first and second mixers, and first and second low-pass filters, first and second gain/bias adjustment means, and a first phase shifter,
   wherein high frequency output terminals of said first and second mixers are connected to each other; an output terminal of said first low-pass filter is connected to an input terminal of said first mixer; the input terminal of said first low-pass filter is directly connected to an output terminal of said first gain/bias adjustment means; the output terminal of the second low-pass filter is connected to an input terminal of the second mixer; the input terminal of the second low-pass filter is directly connected to an output terminal of said second gain/bias adjustment means; a first output terminal of said first phase shifter is connected to a local signal input terminal of said first mixer; a second output terminal of said first phase shifter is connected to a local signal input terminal of said second mixer; and input signals are applied to an input terminal of said first gain/bias adjustment means and an input terminal of said second gain/bias adjustment means, respectively,
   wherein each circuit of said first and second low-pass filters is composed of a filter whose order is at least a second order, and
   wherein each of said first and second low-pass filter circuits is composed of two sets of first and second Sallen-Key type filter circuits,
   said first and second Sallen-Key type filter circuits are each composed of a first, second, third, and fourth resistors, a first and second capacitors, and a first and second transistors,
   a first terminal of said first resistor is an input terminal of said filter circuit; a second terminal of said first resistor is connected to a first terminal of said second resistor; a second terminal of said second resistor is connected to a base of said first transistor; a first terminal of said first capacitor is connected to the second terminal of said first resistor; a second terminal of said first capacitor is connected to an emitter of said first transistor; a first terminal of said second capacitor is connected to the second terminal of said second resistor; a second terminal of said second capacitor is connected to a grounding potential; a collector of said first transistor is an output terminal of said filter circuit; a first terminal of said third resistor is connected to the emitter of said first transistor; a second terminal of said third resistor is connected to a grounding potential; a collector and a base of said second transistor are connected to the first terminal of the first resistor; a first terminal of said fourth resistor is connected to an emitter terminal of said second transistor; and a second terminal of said fourth resistor is connected to a grounding potential, each of said first and second gain/bias adjustment means is composed of: a first differential pair serving as a voltage/current converter circuit that converts a differential voltage into a differential current; and a second and third differential pairs comprising a first and second collector output terminals, a first and second base input terminals, and an emitter coupling input terminal, and a first collector output terminal of said first differential pair is connected to said input terminal of said first Sallen-Key filter circuit; a second collector output terminal of said first differential pair is connected to an input terminal of said second Sallen-Key filter circuit; an output terminal of said first Sallen-Key filter circuit is connected to an emitter coupling input terminal of said second differential pair; an output terminal of said second Sallen-Key filter circuit is connected to an emitter coupling input terminal of said third differential pair; first collector output terminals of said second and third differential pairs are connected to each other; second collector output terminals of said second and third differential pairs are connected to each other; a second base input terminal of said third differential pair is connected to a first base input terminal of said second differential pairs; and a first base input terminal of said third differential pair is connected to a second base input terminal of said second differential pair.

3. A direct-conversion transmitting circuit, characterized by a local modulation circuit comprising first and second mixers, and first and second low-pass filters, first and second gain/bias adjustment means, and a first phase shifter, wherein high frequency output terminals of said first and second mixers are connected to each other; an output terminal of said first low-pass filter is connected to an input terminal of said first mixer; the input terminal of said first low-pass filter is directly connected to an output terminal of said first gain/bias adjustment means; the output terminal of the second low-pass filter is connected to an input terminal of the second mixer; the input terminal of the second low-pass filter is directly connected to an output terminal of said second gain/bias adjustment means; a first output terminal of said first phase shifter is connected to a local signal input terminal of said first mixer; a second output terminal of said first phase shifter is connected to a local signal input terminal of said second mixer; and input signals are applied to an input terminal of said first gain/bias adjustment means and an input terminal of said second gain/bias adjustment means, respectively, and wherein said first and second mixers are each composed of a differential circuit, and Input terminal pairs of said first and second mixers are provided with a first and second DC offset correction circuits to which output terminal pairs are connected, each of said first and second DC offset correction circuits is composed of a control means having a DA converter, an AD converter, and two outputs, one output of said control means is connected to an input terminal of said DA converter; the other output of said control means is connected to an input terminal of said AD converter; respective output pairs of said DA converter and said AD converter are connected to each other and thereby are said output terminal pairs, and the control means operates said DA converter before the direct-conversion transmitting circuit generates a signal, converts the signal to a logical signal in accordance with a magnitude of a DC component generated at each input terminal of said first and second mixers, and has a function of generating, from said AD converter, a DC level for offsetting the DC component on the basis of a value of the logical signal and a function of storing an optimal level converted into said logical signal.

4. A direct-conversion transmitting circuit, characterized by a local modulation circuit comprising first and second mixers, and first and second low-pass filters, first and second gain/bias adjustment means, and a first phase shifter, wherein high frequency output terminals of said first and second mixers are connected to each other; an output terminal of said first low-pass filter is connected to an input terminal of said first mixer; the input terminal of said first low-pass filter is directly connected to an output terminal of said first gain/bias adjustment means; the output terminal of the second low-pass filter is connected to an input terminal of the second mixer; the input terminal of the second low-pass filter is directly connected to an output terminal of said second gain/bias adjustment means; a first output terminal of said first phase shifter is connected to a local signal input terminal of said first mixer; a second output terminal of said first phase shifter is connected to a local signal input terminal of said second mixer; and input signals are applied to an input terminal of said first gain/bias adjustment means and an input terminal of said second gain/bias adjustment means, respectively, and wherein the direct-conversion transmitting circuit is composed of: a first and second control means each having a first and second DA converters, an AD converter, and two outputs; a DC offset correction circuit having a first, second, third and fourth output terminals pairs; and further a switching means having two sets of output terminal pairs, an output of said first control means is connected to an input of said first DA converter; an output of said second control means is connected to an input of said second DA converter; an output pair of said first DA converter is connected to a first output terminal pair of said DC offset correction circuit; an output pair of said second DA converter is connected to a second output terminal pair of said DC offset correction circuit; and an output of said AD converter is connected to a third output terminal pair of said DC offset correction circuit, said first and second mixers each are composed of a differential circuit, in which the first output terminal pair of said DC offset correction circuit is connected to an input terminal pair of said first mixer; the second output terminal pair of said DC offset correction circuit is connected to an input terminal pair of said second mixer; and the third output pair of said DC offset correction circuit is connected to an input terminal pair of said switching means, one output terminal pair of said switching means is connected to the input terminal pair of said first mixer; and the other output terminal pair of said switching means is connected to the input terminal pair of said second mixer, and each of said first and second control means operates said first and second DA converters before the direct-conversion transmitting circuit generates a signal, and converts the signal to a logical signal based on magnitude of a DC component generated at input terminals of said first and second mixers, and has a function of switching said switching means such that a DC level generated by said AD converters is applied to the input terminal pairs of said first and second mixers at a different period in order to offset a DC component generated at each of the input terminal pairs of said first and second mixers in accordance with a value of the logic signal, and a function of storing an optical level converted into said logical signal.

5. A direct-conversion transmitting circuit comprising:
first and second mixers;
first and second low-pass filters;
first and second gain/bias adjusters; and
a first phase shifter,
wherein high frequency output terminals of said first and second mixers are connected to each other,
wherein an output terminal of said first low-pass filter is directly connected to an input terminal of said first mixer, and an input terminal of said first low-pass filter is connected to an output terminal of said first gain/bias adjuster to suppress a noise generated by said first gain/bias adjuster,
wherein an output terminal of said second low-pass filter is directly connected to an input terminal of said second mixer, and an input terminal of said second low-pass filter is connected to an output terminal of said second gain/bias adjuster to suppress a noise generated by said second gain/bias adjuster,
wherein a first output terminal of said first phase shifter is connected to a local signal input terminal of said first mixer, and a second output terminal of said first phase shifter is connected to a local signal input terminal of said second mixer,
wherein an input signal generated from an output signal of a first AD converter is applied to an input terminal of said first gain/bias adjuster to reduce difference in gain and bias levels between an input signal of said first mixer and an output signal of said first AD signal of said first AD converter, and
wherein an input signal generated from an output signal of a second AD converter is applied to an input terminal of said second gain/bias adjuster to reduce difference in gain and bias levels between an input signal of said second mixer and an output signal of said second AD converter.

6. The direct-conversion transmitting circuit according to claim 5,
wherein said first phase shifter comprises a frequency divider circuit.

7. The direct-conversion transmitting circuit according to claim 5,
wherein each of said first and second low-pass filters comprises a filter circuit whose order is at least a second order.

8. The direct-conversion transmitting circuit according to claim 7,
wherein each of said first and second low-pass filter circuits comprises a Sallen-Key type filter circuit, said Sallen-Key type filter circuit includes first and second resistors, first and second capacitors, and a first transistor,
a first terminal of said first resistor acts as an input of the filter, a second terminal of said first resistor is connected to a first terminal of said second resistor, a second terminal of said second resistor is connected to a base of the first transistor, a first terminal of said first capacitor is connected to the second terminal of said first resistor, a second terminal of said first capacitor is connected to an emitter of said first transistor, a first terminal of said second capacitor is connected to the second terminal of said second resistor, a second terminal of said capacitor is connected to a grounding potential, a collector of said first transistor is connected to a power source potential and an emitter of said first transistor acts as an output terminal of the filter.

9. The direct-conversion transmitting circuit according to claim 7,
wherein each of said first and second low-pass filter circuits comprises first and second Sallen-Key type filter circuits, each of said first and second Sallen-Key type filter circuits includes first, second, third, and fourth resistors, first and second capacitors, and first and second transistors,
a first terminal of said first resistor acts as an input terminal of said filter circuit, a second terminal of said first resistor is connected to a first terminal of said second resistor, a second terminal of said second resistor is connected to a base of said first transistor, a first terminal of said first capacitor is connected to the second terminal of said first resistor, a second terminal of said first capacitor is connected to an emitter of said first transistor, a first terminal of said second capacitor is connected to the second terminal of said second resistor, a second terminal of said second capacitor is connected to a grounding potential, a collector of said first transistor acts as an output terminal of said filter circuit, a first terminal of said third resistor is connected to the emitter of said first transistor, a second terminal of said third resistor is connected to a grounding potential, a collector and a base of said second transistor are connected to the first terminal of the first resistor, a first terminal of said fourth resistor is connected to an emitter terminal of said second transistor and a second terminal of said fourth resistor is connected to a grounding potential;
wherein each of said first and second gain/bias adjusters comprises a first differential transistor pair serving as a voltage/current converter circuit that converts a differential voltage into a differential current,
a first collector output terminal of said first differential transistor pair is connected to the input terminal of said first Sallen-Key filter circuit and a second collector output terminal of said first differential transistor pair is connected to the input terminal of said second Sallen-Key filter circuit; and
wherein each of said first and second mixers comprises second and third differential transistor pairs comprising first and second collector output terminals, first and second base input terminals, and an emitter coupling input terminal, an output terminal of said first Sallen-Key filter circuit is connected to an emitter coupling input terminal of said second differential transistor pair and an output terminal of said second Sallen-Key filter circuit is connected to an emitter coupling input terminal of said third differential transistor pair, first collector output terminals of said second and third differential transistor pairs are connected to each other, second collector output terminals of said second and third differential transistor pairs are connected to each other, a second base input terminal of said third differential transistor pair is connected to a first base input terminal of said second differential transistor pairs, and a first base input terminal of said third differential transistor pair is connected to a second base input terminal of said second differential transistor pair.

10. The direct-conversion transmitting circuit according to claim 5, wherein each of said first and second mixers comprises a differential circuit, and the direct-conversion transmitting circuit further comprises:

first and second DC offset correction circuits each of which is coupled, via a pair of output terminals thereof, to a pair of input terminals of a corresponding one of said first and second mixers each of said first and second DC offset correction circuits includes a control means, a DA converter, an AD converter, and a pair of output terminals, wherein at each DC offset correction circuit an output of said control means is connected to an input terminal of said DA converter, another output of said control means is connected to an input terminal of said AD converter, respective output pairs of said DA converter and said AD converter are connected to each other and represent the output terminal pair of that DC correction circuit, and wherein each control means operates the corresponding said DA converter before the direct-conversion transmitting circuit generates a signal, converts the signal to a logical signal in accordance with a magnitude of a DC component generated at each input terminal of the corresponding one said first and second mixers, and has a function of generating, from the corresponding said AD converter, a DC level for offsetting the DC component on the basis of a value of the logical signal and a function of storing an optimal level converted into said logical signal.

11. The direct-conversion transmitting circuit according to claim 5, further comprising first and second control means, first and second (DA) converters, a further (AD) converter, and two outputs; a DC offset correction circuit having first, second, third and fourth output terminals pairs; and further a switching means having two sets of output terminal pairs, wherein:

an output of said first control means is connected to an input of said first DA converter; and output of said second control means is connected to an input of said second DA converter, an output pair of said first DA converter is connected to a first output terminal pair of said DC offset correction circuit; an output pair of said second DA converter is connected to a second output terminal pair of said DC offset correction circuit; and an output of said further AD converter is connected to a third output terminal pair of said DC offset correction circuit, said first and second mixers are each comprised of a differential circuit, in which the first output terminal pair of said DC offset correction circuit is connected to an input terminal pair of said first mixer the second output terminal pair of said DC offset correction circuit is connected to an input terminal pair of said second mixer; and the third output pair of said DC Offset correction circuit is connected to an input terminal pair of said switching means, one output terminal pair of said switching means is connected to the input terminal pair of said first mixer; and the other output terminal pair of said switching means is connected to the input terminal pair of said second mixer, and each of said first and second control means operates said first and second DA converters before the direct-conversion transmitting circuit generates a signal, and converts the signal to a logical signal based on magnitude of a DC component generated at input terminals of said first and second mixers, and has a function of switching said switching means such that a DC level generated by said AD converters is applied to the input terminal pairs of said first and second mixers at a different period in order to offset a DC component generated at each of the input terminal pairs of said first and second mixers in accordance with a value of the logic signal, and a function of storing an optical level converted into said logical signal.

12. A integrated transmitting/receiving circuit including a transmitting section and a receiving section which are integrated on the same chip, wherein the transmitting section comprises a first direct-conversion transmitting circuit using the direct-conversion transmitting circuit according to claim 5, and third and fourth amplifiers, and wherein the receiving section comprises first to third low noise amplifiers, third and fourth mixers, a first to third frequency dividers, a first frequency synthesizer, a first voltage control type oscillator, and first and second baseband frequency amplifiers/filter rows, wherein an output of said first direct-conversion transmitting circuit is connected to respective input circuits of said third and fourth amplifiers; said third and fourth amplifiers are used as independent output terminals; output terminals of said first to third low noise amplifiers are connected to one another to connect inputs of said third and fourth mixers; outputs of said third and fourth mixers are connected to said first and second baseband frequency amplifiers/filter rows; a first output of said first frequency divider is connected to a local signal input terminal of said third mixer; a second output of said first frequency divider is connected to a local signal input terminal of said fourth mixer circuit an output terminal of said first frequency synthesizer is connected to a control voltage input terminal of said first voltage control oscillator; an output of said first voltage control oscillator is connected to an input of said first frequency synthesizer; and output of said first voltage control oscillator is connected to an input terminal of said second frequency divider having two functions of executing and bypassing a frequency dividing function; said second frequency divider is connected to an input of said first frequency divider; an output of said first voltage control oscillator is connected to an input terminal of said third frequency divider having two functions of executing and bypassing a frequency dividing function; said third frequency divider is connected to an input terminal of a first phase shifter in said first direct-conversion transmitting circuit, and said first phase shifter is a frequency shifter.

13. The integrated transmitting/receiving circuit according to claim 12,
wherein a fourth frequency divider is interposed between second and third frequency dividers whose respective input terminals are connected to the input terminal of said first voltage control oscillator.

14. The integrated transmitting/receiving circuit according to claim 13, wherein said fourth frequency divider has two functions of executing and bypassing a frequency dividing function, and
a fourth low noise amplifier is further provided which has an input terminal independent from respective input terminals of the other low noise amplifiers and has an output terminal connected to respective output terminals of the other low noise amplifiers.

* * * * *